(12) United States Patent
Yamagishi

(10) Patent No.: US 11,244,980 B2
(45) Date of Patent: Feb. 8, 2022

(54) SEMICONDUCTOR DEVICE

(71) Applicant: SONY SEMICONDUCTOR SOLUTIONS CORPORATION, Kanagawa (JP)

(72) Inventor: Hajime Yamagishi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 111 days.

(21) Appl. No.: 16/625,115

(22) PCT Filed: Jun. 27, 2018

(86) PCT No.: PCT/JP2018/024341
§ 371 (c)(1),
(2) Date: Dec. 20, 2019

(87) PCT Pub. No.: WO2019/004276
PCT Pub. Date: Jan. 3, 2019

(65) Prior Publication Data
US 2020/0185445 A1 Jun. 11, 2020

(30) Foreign Application Priority Data

Jun. 29, 2017 (JP) .............................. JP2017-127504

(51) Int. Cl.
*H01L 27/146* (2006.01)
(52) U.S. Cl.
CPC .... *H01L 27/14634* (2013.01); *H01L 27/1469* (2013.01); *H01L 27/14636* (2013.01); *H01L 27/14645* (2013.01)
(58) Field of Classification Search
CPC .................. H01L 27/14636; H01L 27/14634
See application file for complete search history.

(56) References Cited

U.S. PATENT DOCUMENTS 8,669,602 B2 * 3/2014 Hayashi ............ H01L 27/14634
257/292
9,093,363 B2 * 7/2015 Sukegawa ............ H04N 5/3745
(Continued)

FOREIGN PATENT DOCUMENTS

JP 2012-064709 3/2012
JP 2012-164870 8/2012
(Continued)

OTHER PUBLICATIONS

International Search Report and Written Opinion prepared by the European Patent Office dated Oct. 24, 2018, for International Application No. PCT/JP2018/024341.
(Continued)

*Primary Examiner* — David A Zarneke
(74) *Attorney, Agent, or Firm* — Sheridan Ross P.C.

(57) ABSTRACT

An imaging device includes a first substrate including a pixel array and a first multilayer wiring layer. The first multilayer wiring layer includes a first wiring that receives electrical signals based on electric charge generated by at least one photoelectric conversion unit, and a plurality of second wirings. The imaging device includes a second substrate including a second multilayer wiring layer and a logic circuit that processes the electrical signals. The second multilayer wiring layer includes a third wiring bonded to the first wiring, and a plurality of fourth wirings. At least one of the plurality of fourth wirings being bonded to at least one of the plurality of second wirings. The second multilayer wiring layer includes at least one fifth wiring that is connected to the plurality of fourth wirings and that receives a power supply signal.

20 Claims, 26 Drawing Sheets

(56) References Cited

U.S. PATENT DOCUMENTS

| | | | |
|---|---|---|---|
| 9,451,131 B2* | 9/2016 | Umebayashi | H01L 27/14634 |
| 9,465,383 B2* | 10/2016 | Siu | G05B 19/4182 |
| 9,565,383 B2* | 2/2017 | Sukegawa | H04N 5/3745 |
| 9,634,052 B2* | 4/2017 | Sukegawa | H01L 27/14627 |
| 9,641,777 B2* | 5/2017 | Sukegawa | H04N 5/369 |
| 9,762,835 B2* | 9/2017 | Sukegawa | H04N 5/37455 |
| 9,765,383 B2* | 9/2017 | Park | C12Q 1/6804 |
| 9,799,695 B2* | 10/2017 | Umebayashi | H01L 27/14632 |
| 10,916,577 B2* | 2/2021 | Umebayashi | H01L 23/481 |
| 10,950,647 B2* | 3/2021 | Umebayashi | H01L 27/14627 |
| 2012/0199930 A1 | 8/2012 | Hayashi | |
| 2012/0293698 A1 | 11/2012 | Sukegawa et al. | |
| 2014/0145288 A1 | 5/2014 | Hayashi | |
| 2015/0312500 A1 | 10/2015 | Sukegawa et al. | |
| 2016/0020240 A1 | 1/2016 | Hayashi | |
| 2016/0286150 A1 | 9/2016 | Sukegawa et al. | |
| 2017/0012075 A1 | 1/2017 | Sukegawa et al. | |
| 2017/0053961 A1 | 2/2017 | Hayashi | |
| 2017/0180668 A1 | 6/2017 | Sukegawa et al. | |
| 2017/0330912 A1 | 11/2017 | Sukegawa et al. | |
| 2018/0097031 A1 | 4/2018 | Sukegawa et al. | |
| 2018/0166493 A1 | 6/2018 | Hayashi | |

FOREIGN PATENT DOCUMENTS

| | | |
|---|---|---|
| JP | 2013-073988 | 4/2013 |
| TW | 201541622 | 11/2015 |

OTHER PUBLICATIONS

Official Action (with English translation) for Taiwan Patent Application No. 107122179, dated Oct. 21, 2021, 11 pages.

* cited by examiner

[Fig. 1]
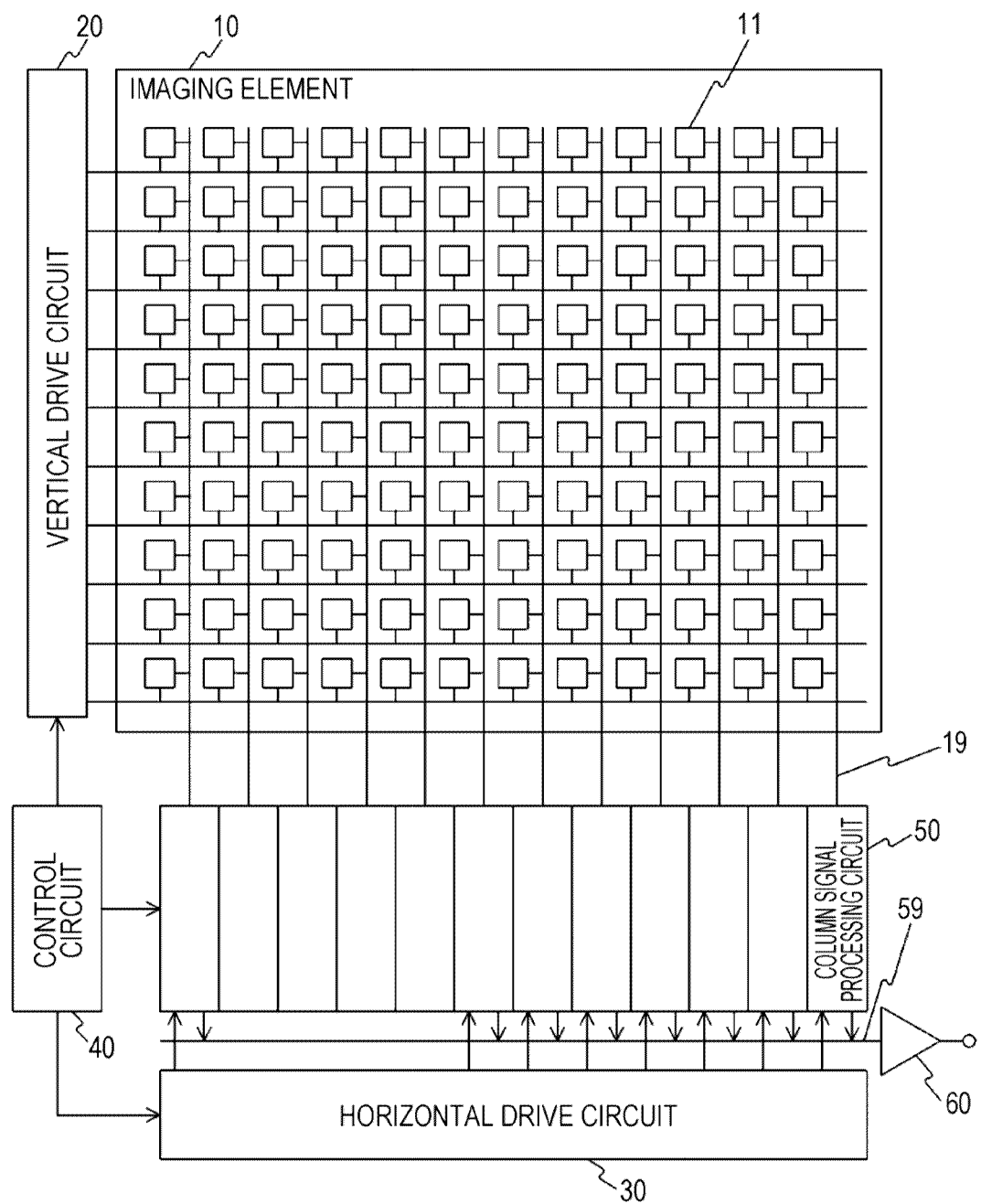

[Fig. 2]
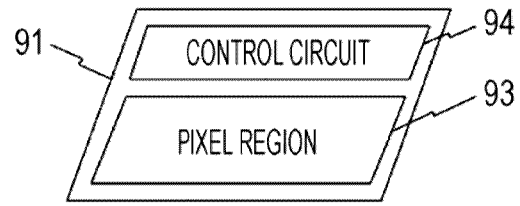
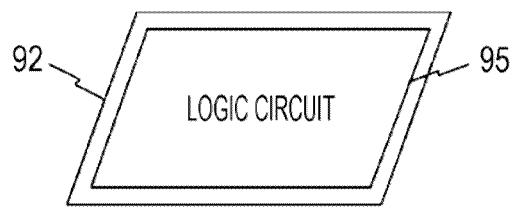
a
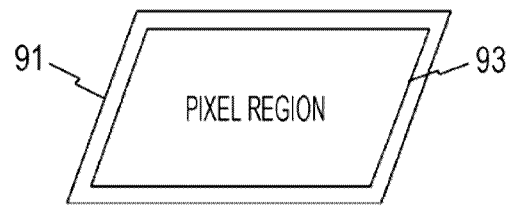
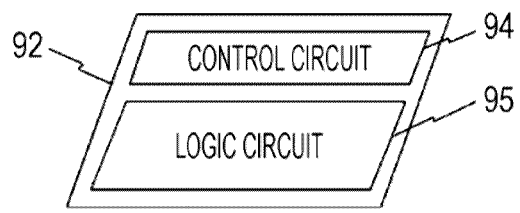
b
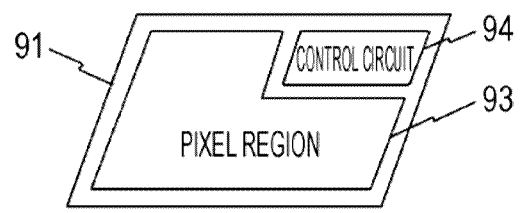
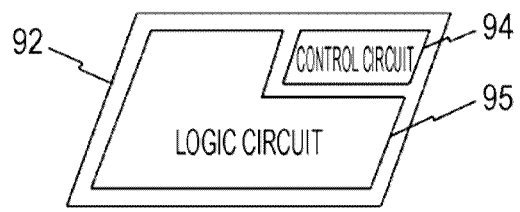
c

[Fig. 3]
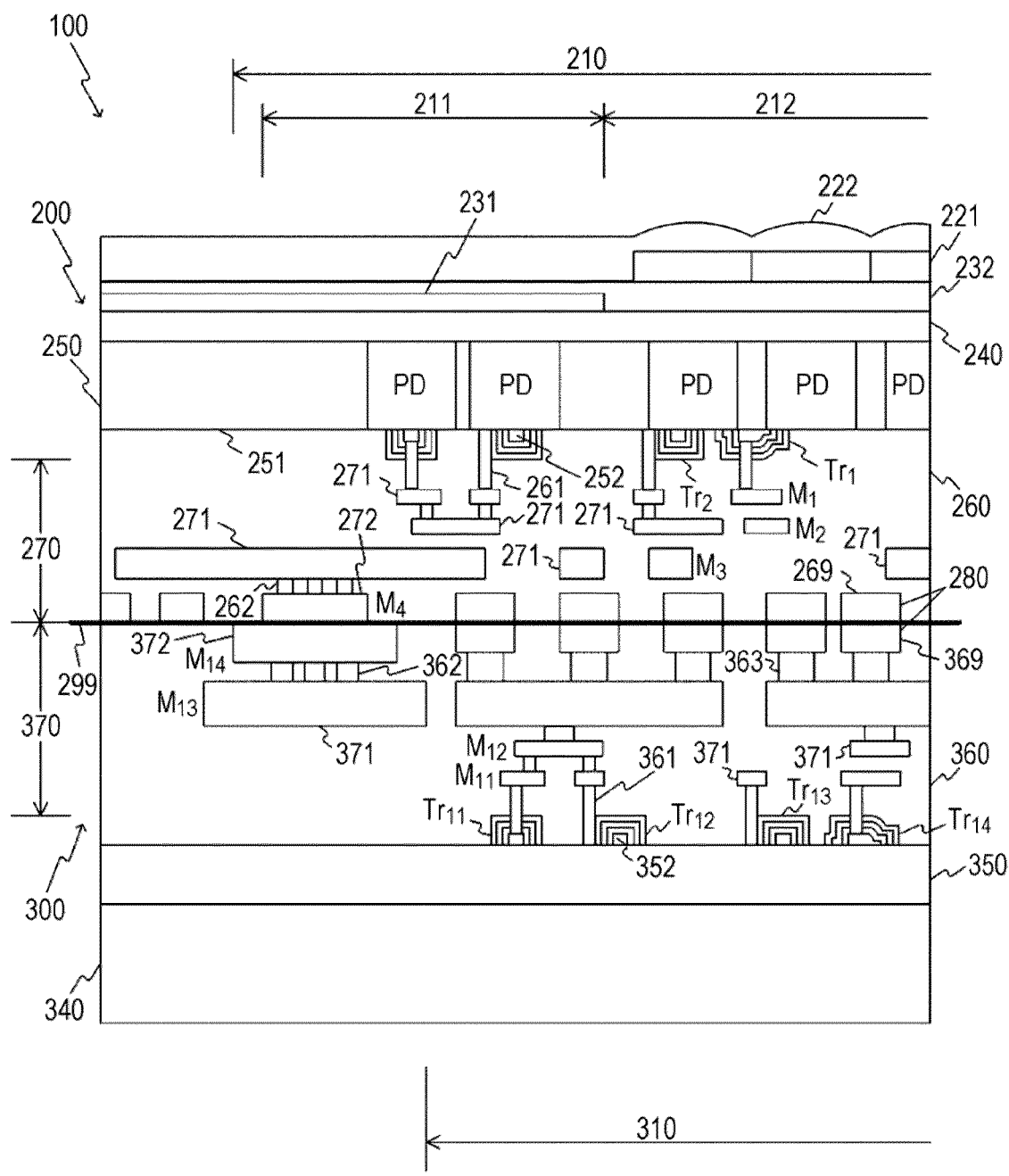

[Fig. 4]
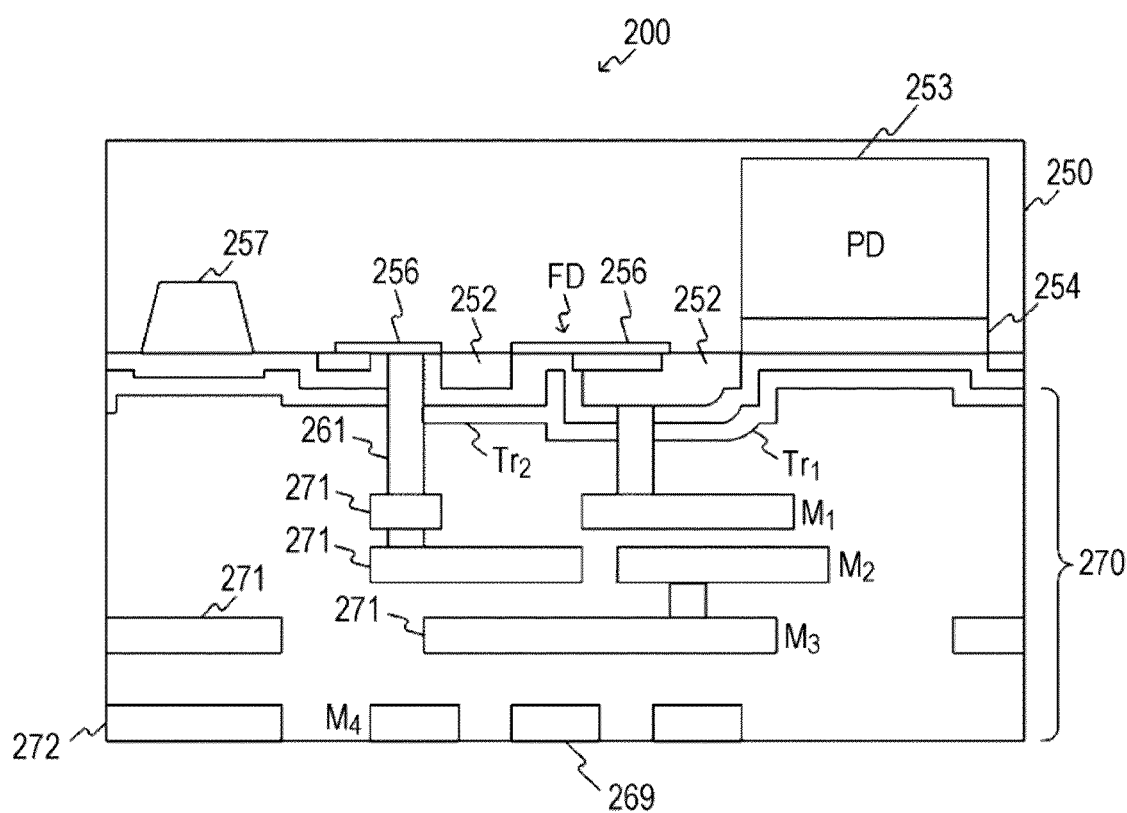

[Fig. 5]
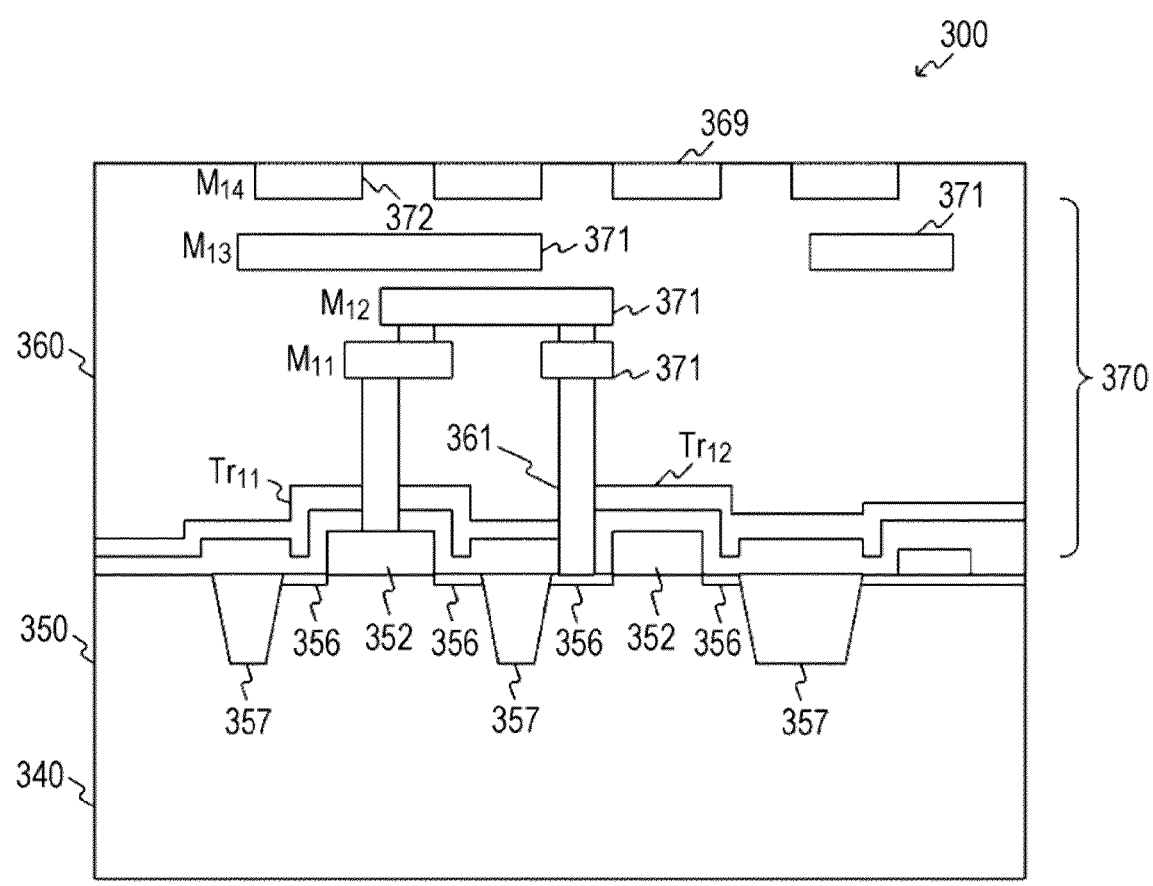

[Fig. 6]
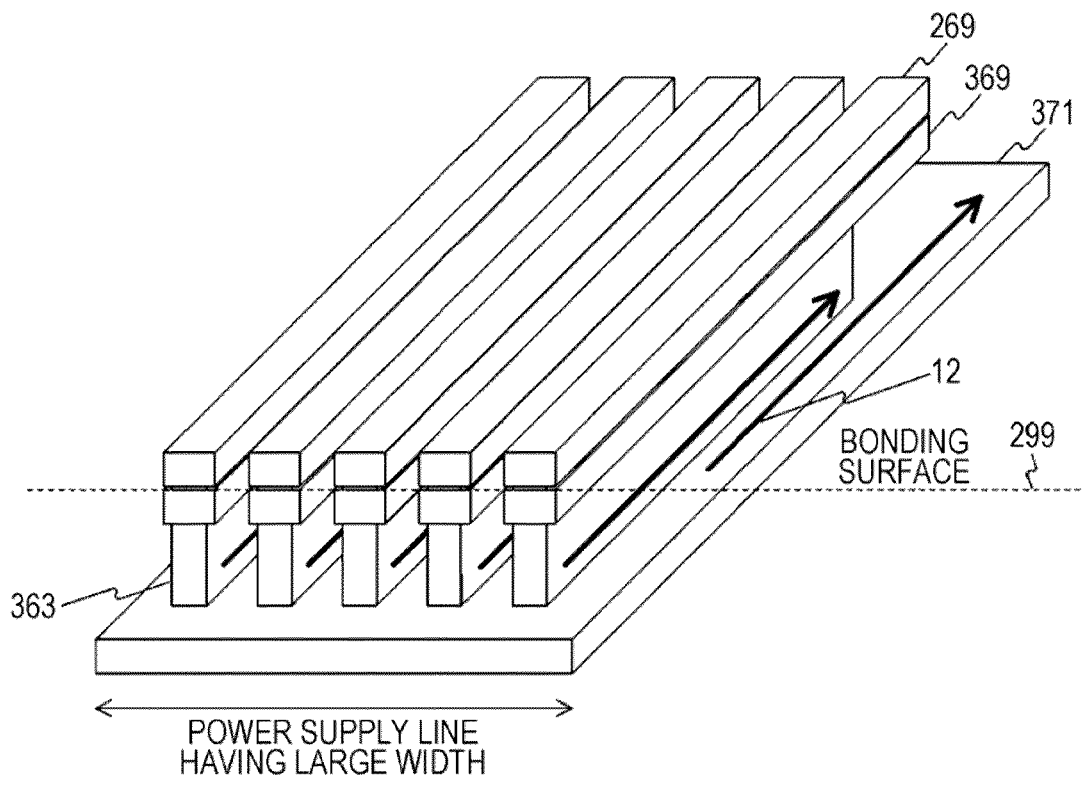
a
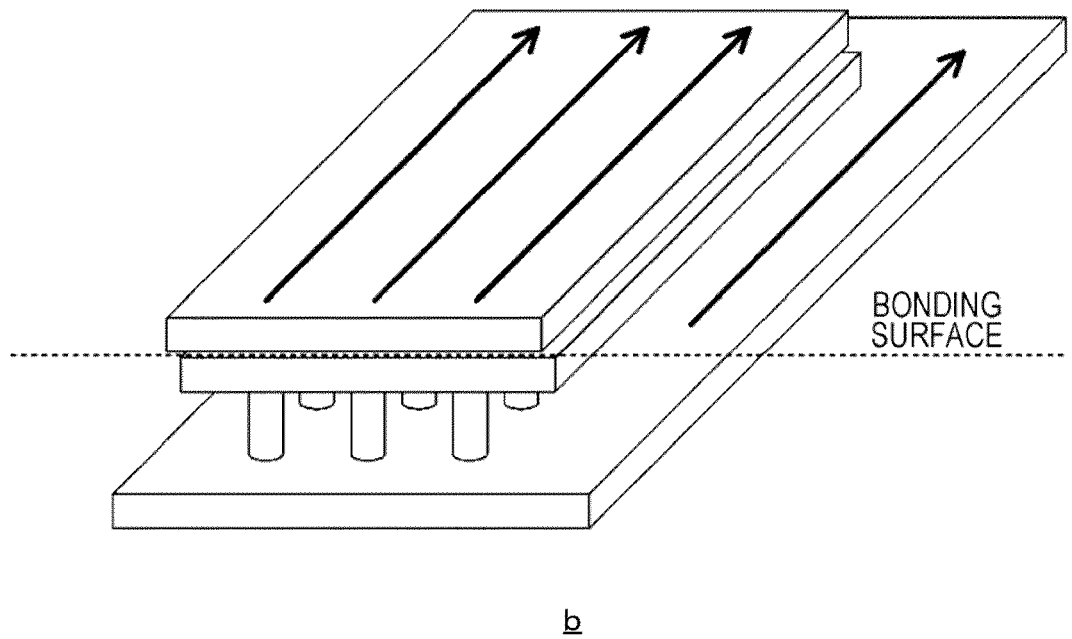
b

[Fig. 7]
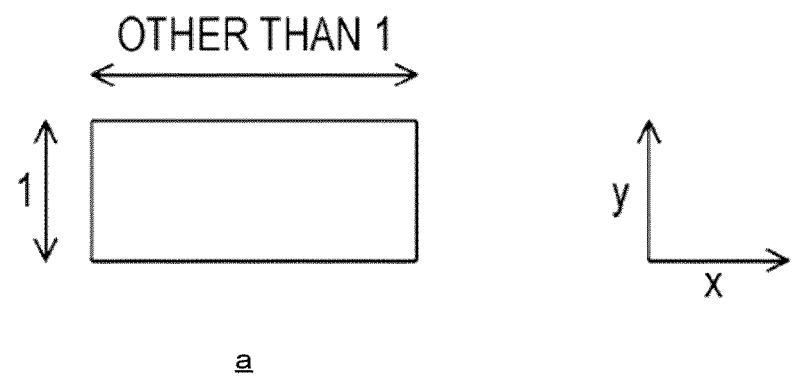
a
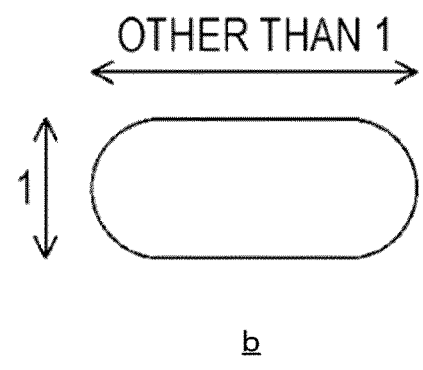
b
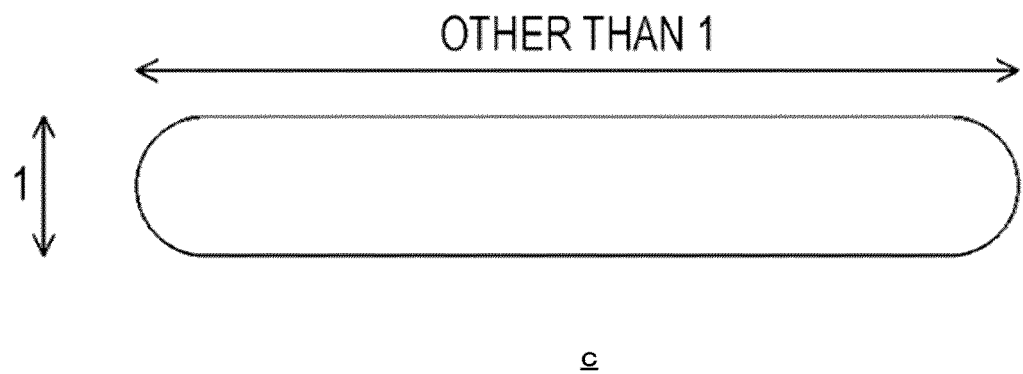
c

[Fig. 8]
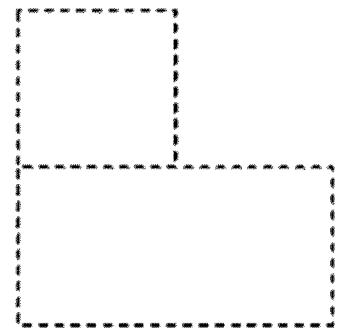
a
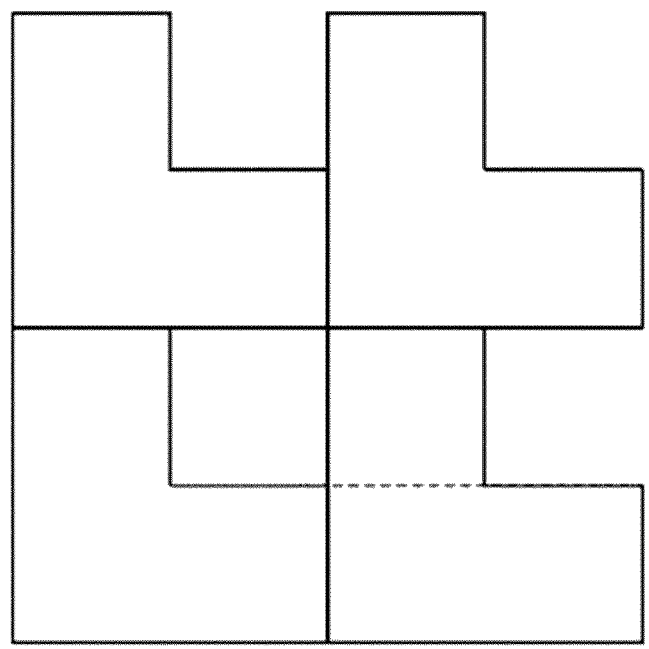
b

[Fig. 9]
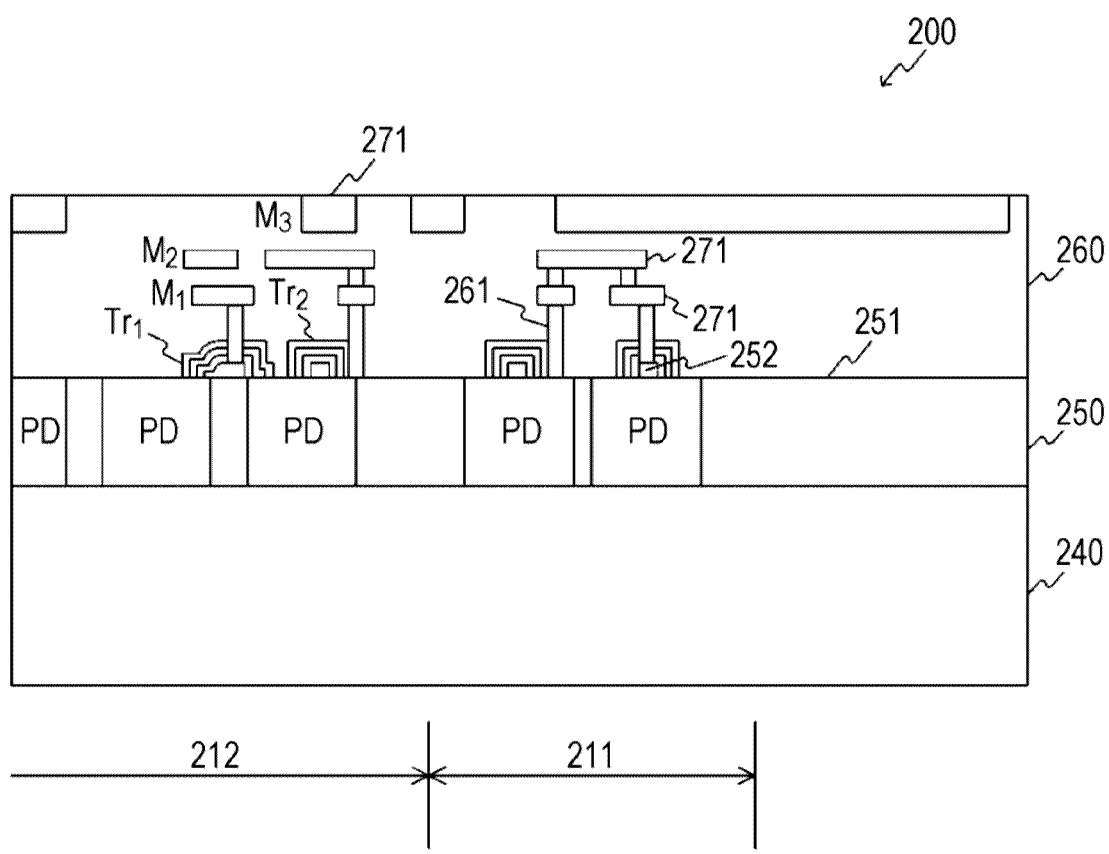

[Fig. 10]
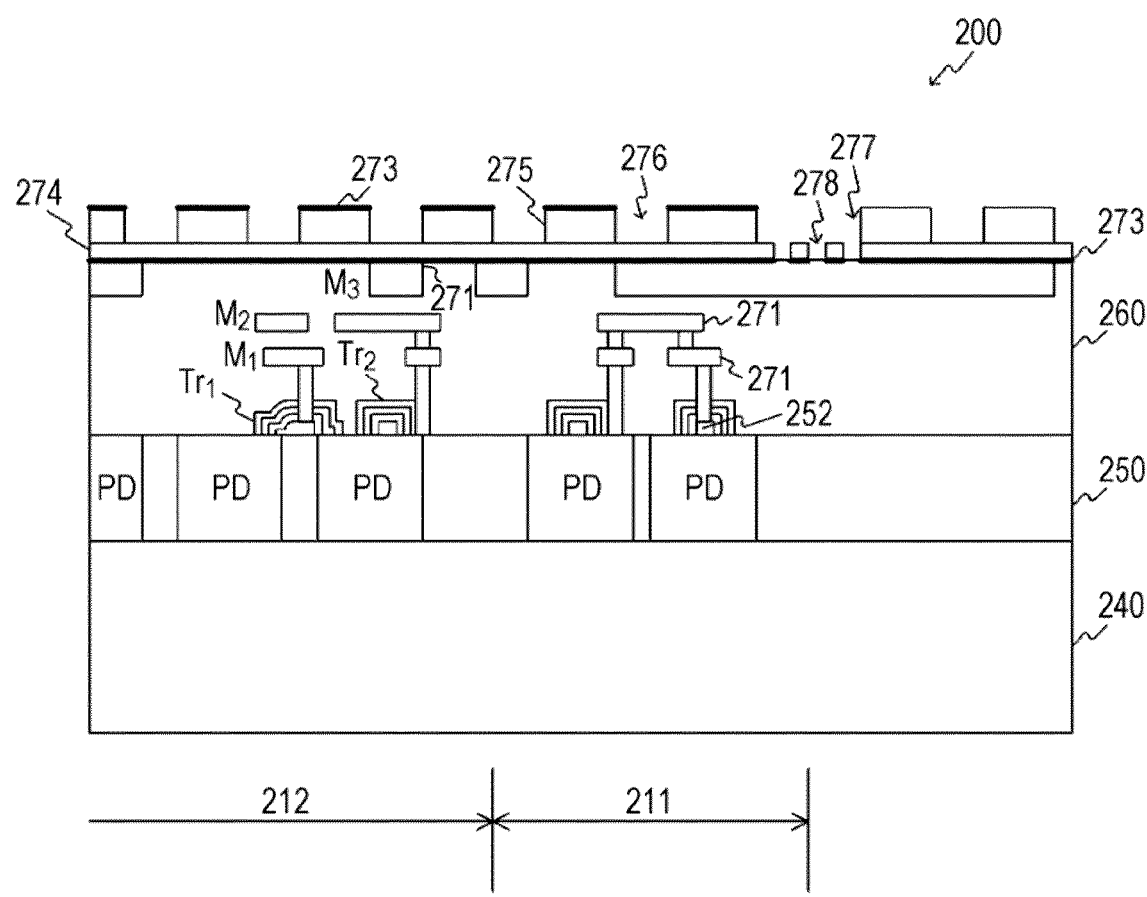

[Fig. 11]
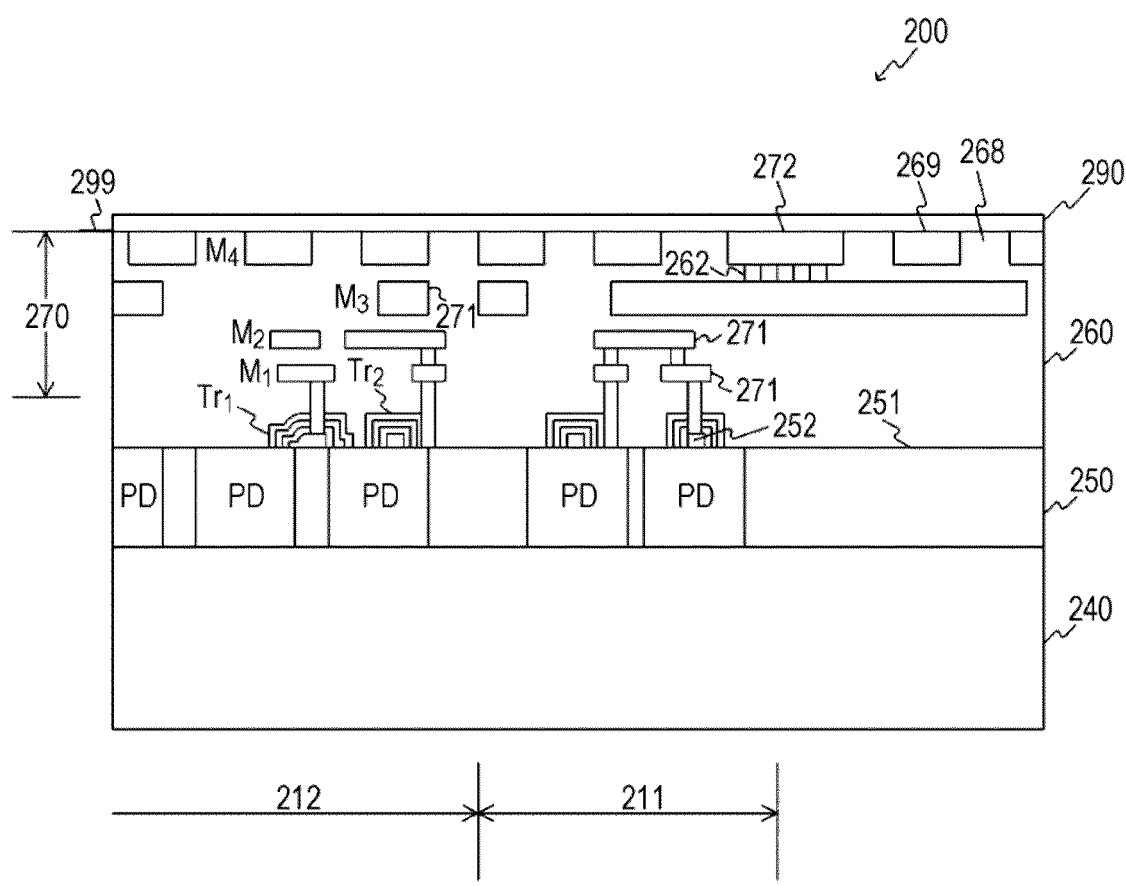

[Fig. 12]
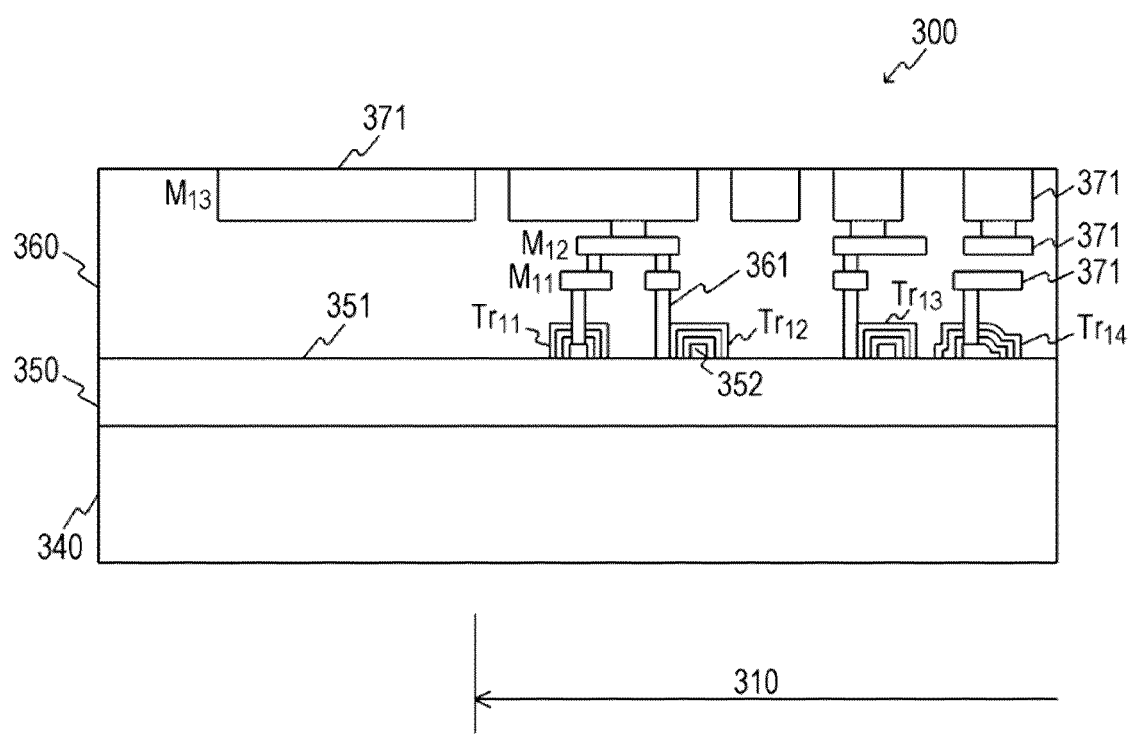

[Fig. 13]
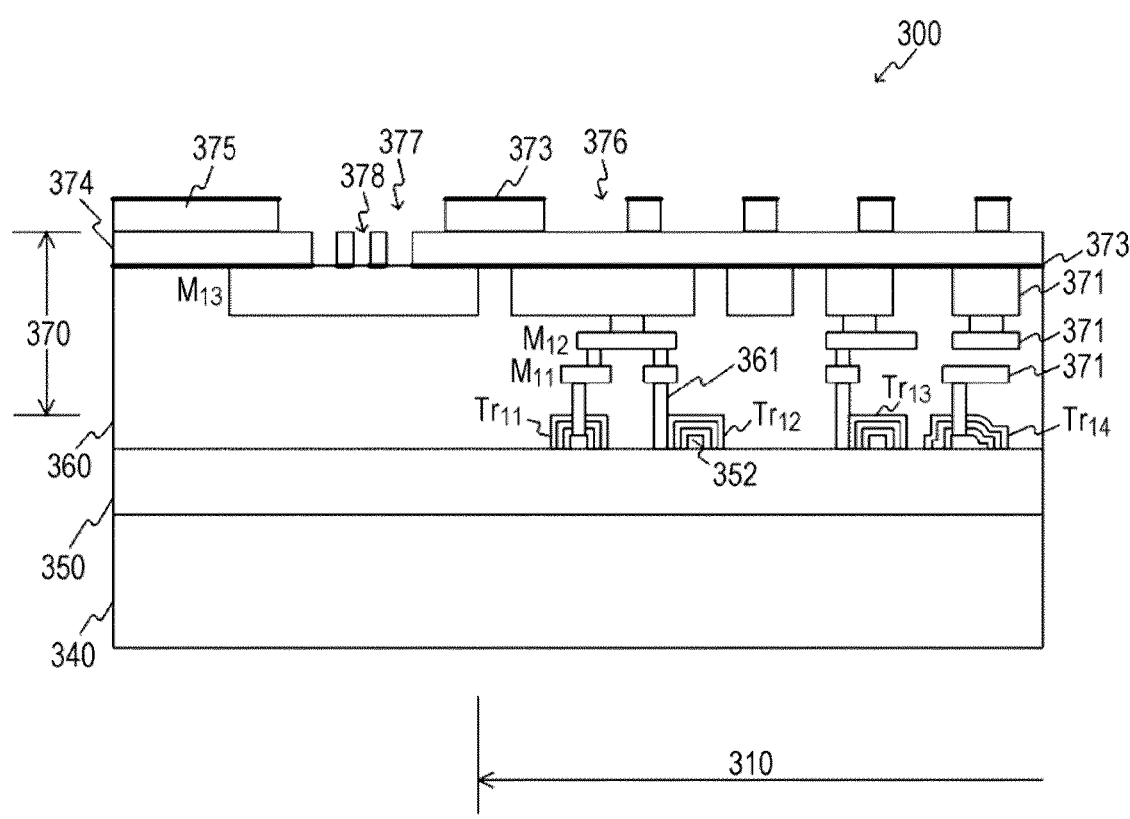

[Fig. 14]
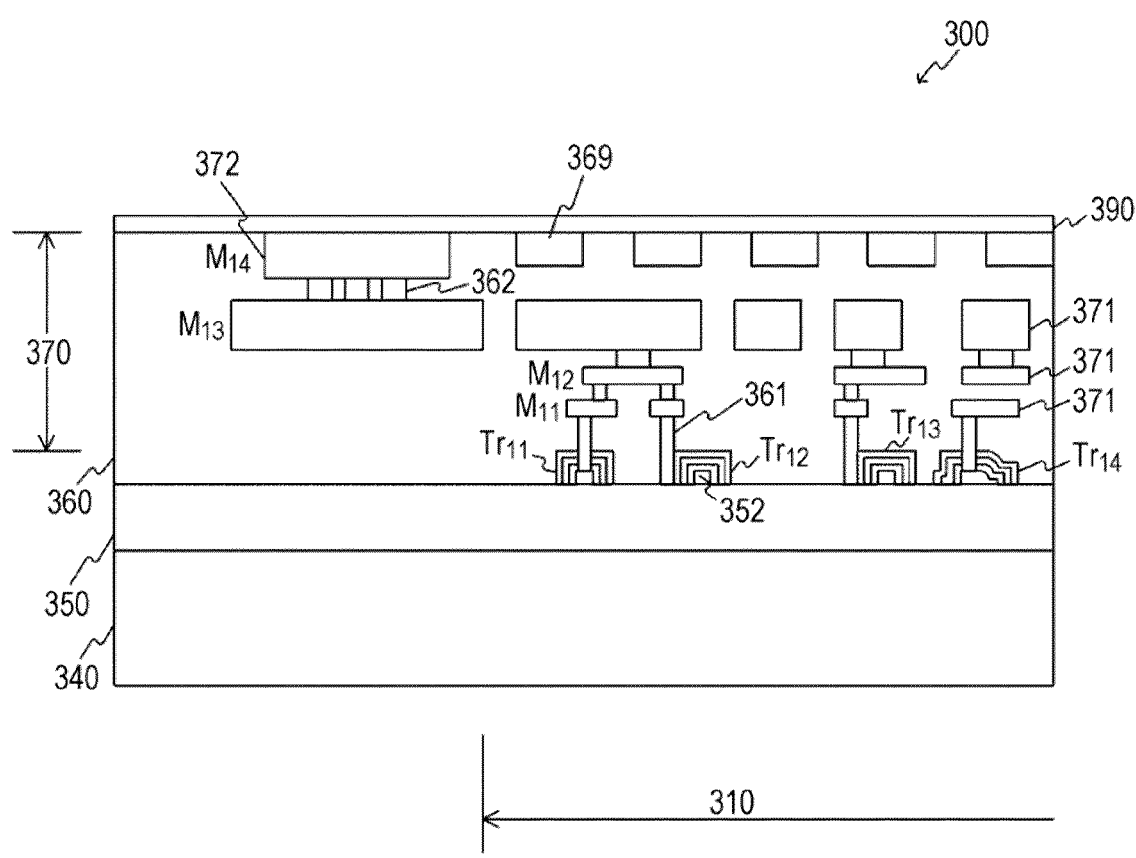

[Fig. 15]
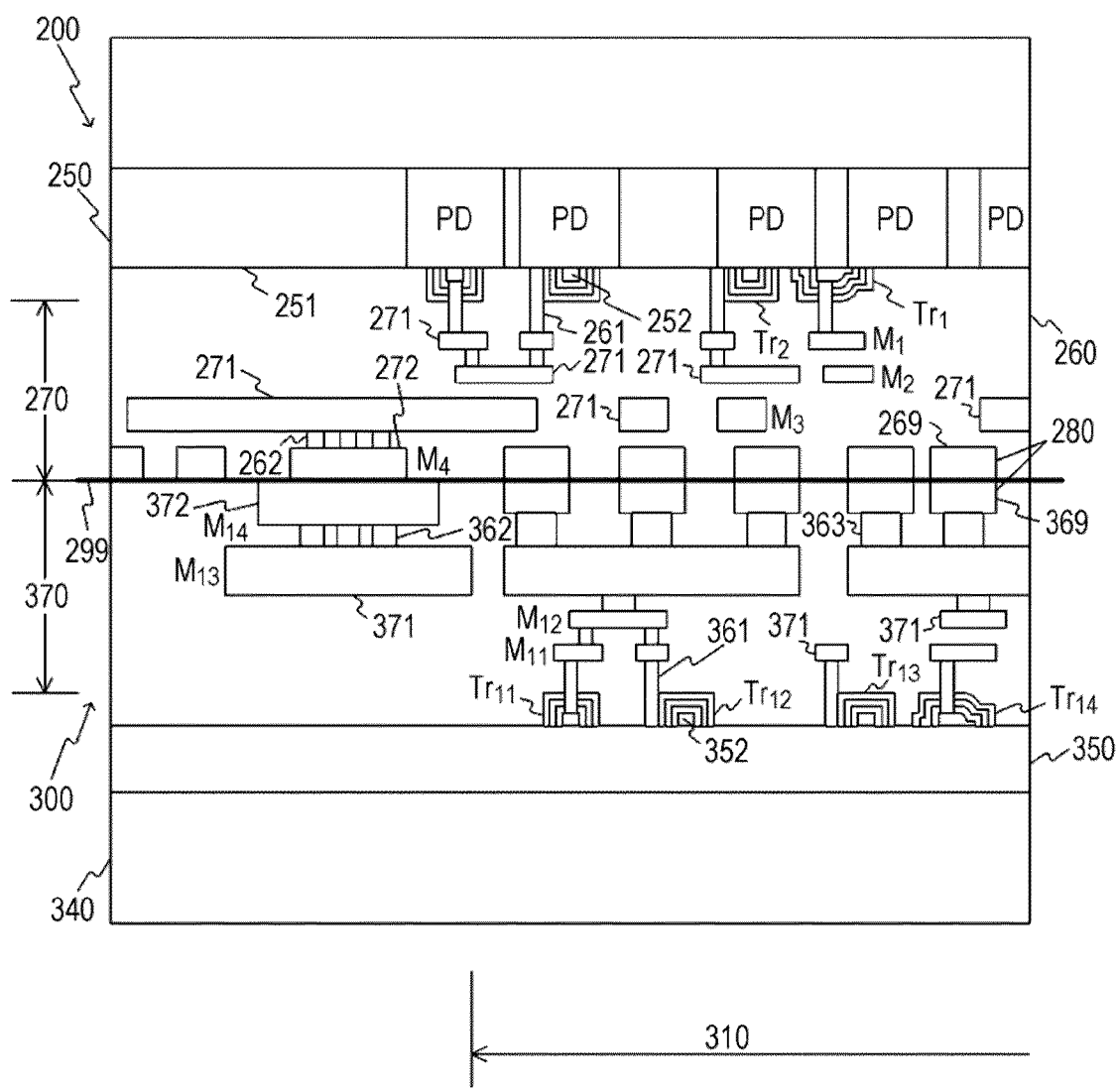

[Fig. 16]
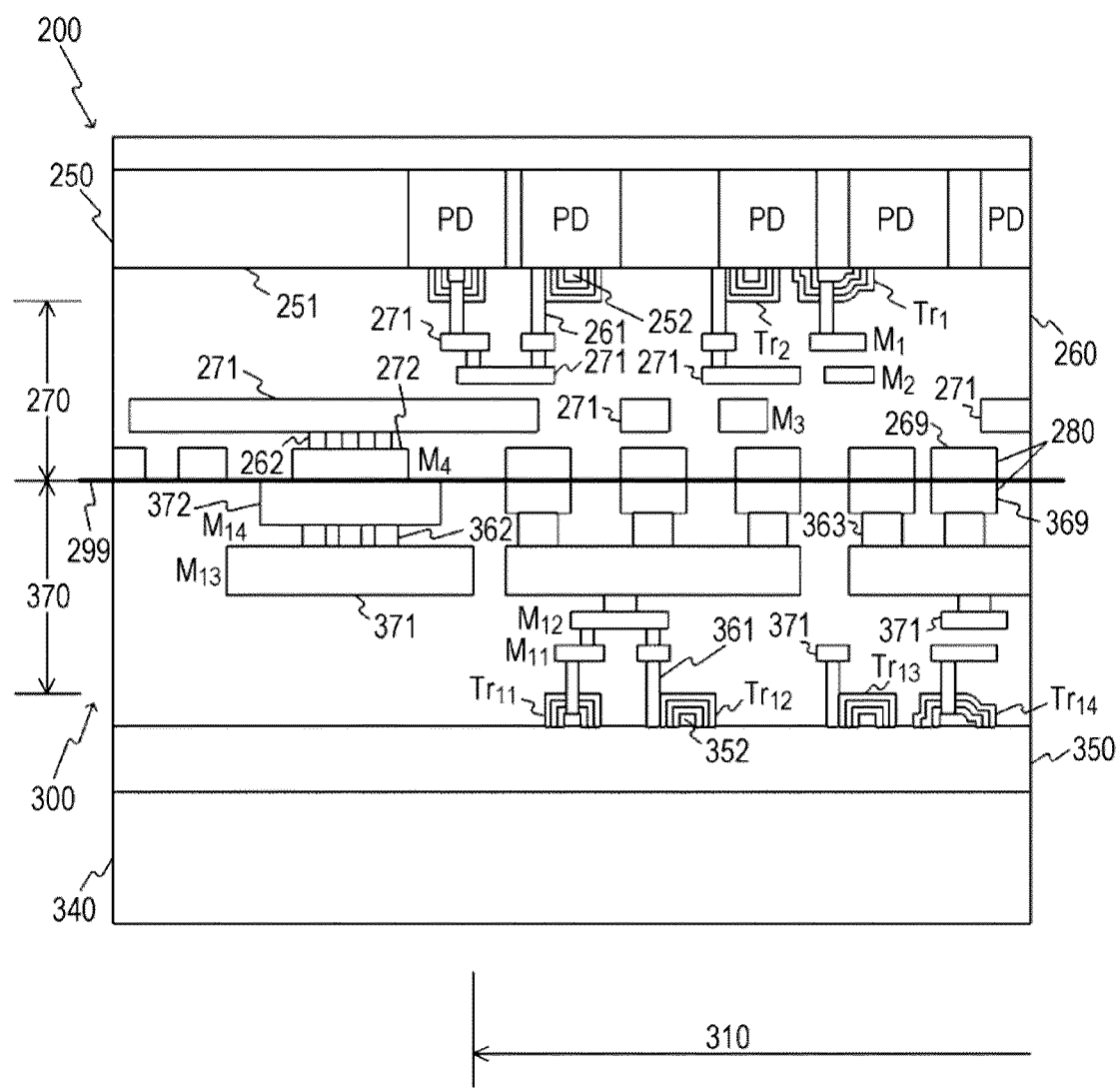

[Fig. 17]
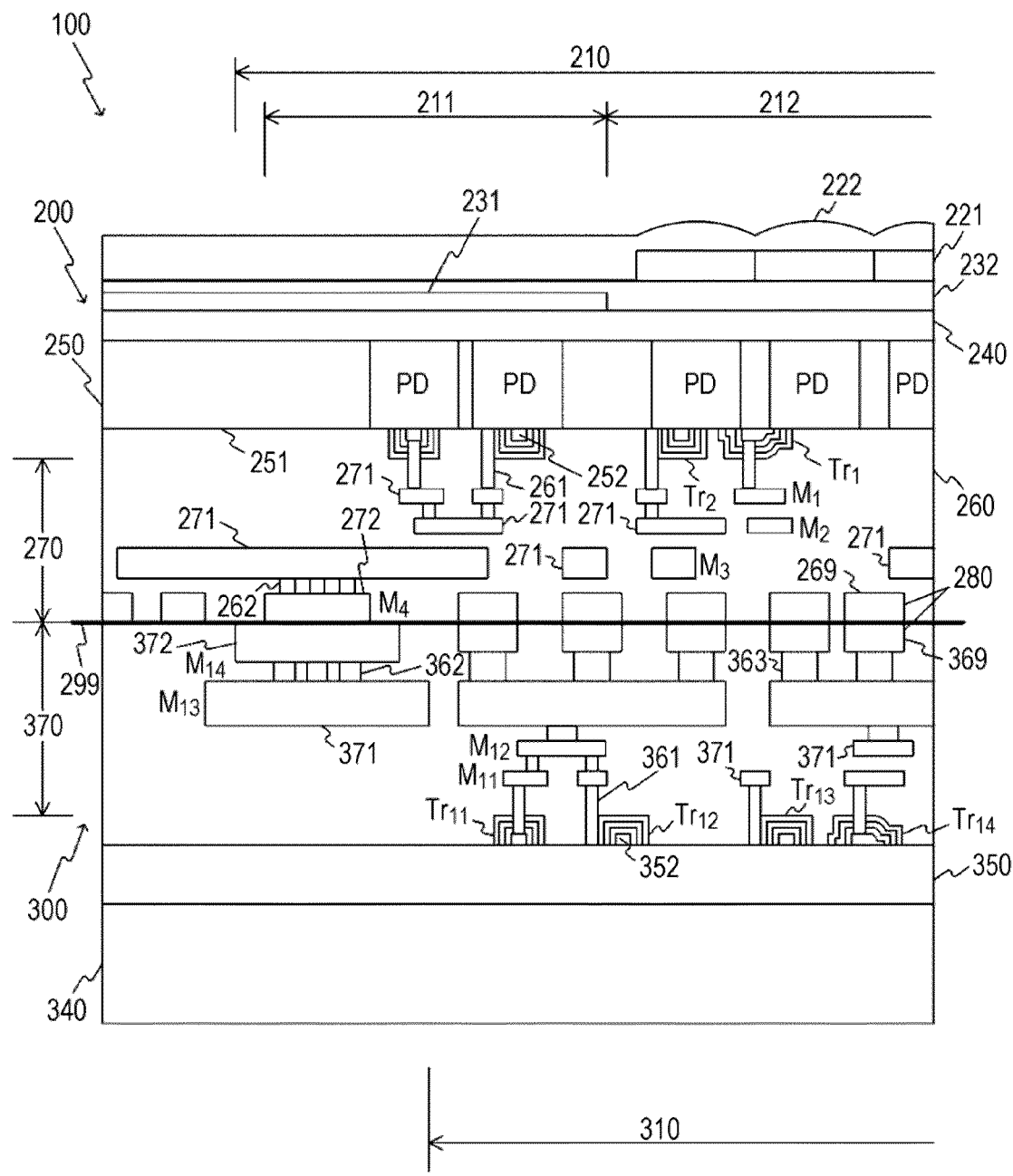

[Fig. 18]
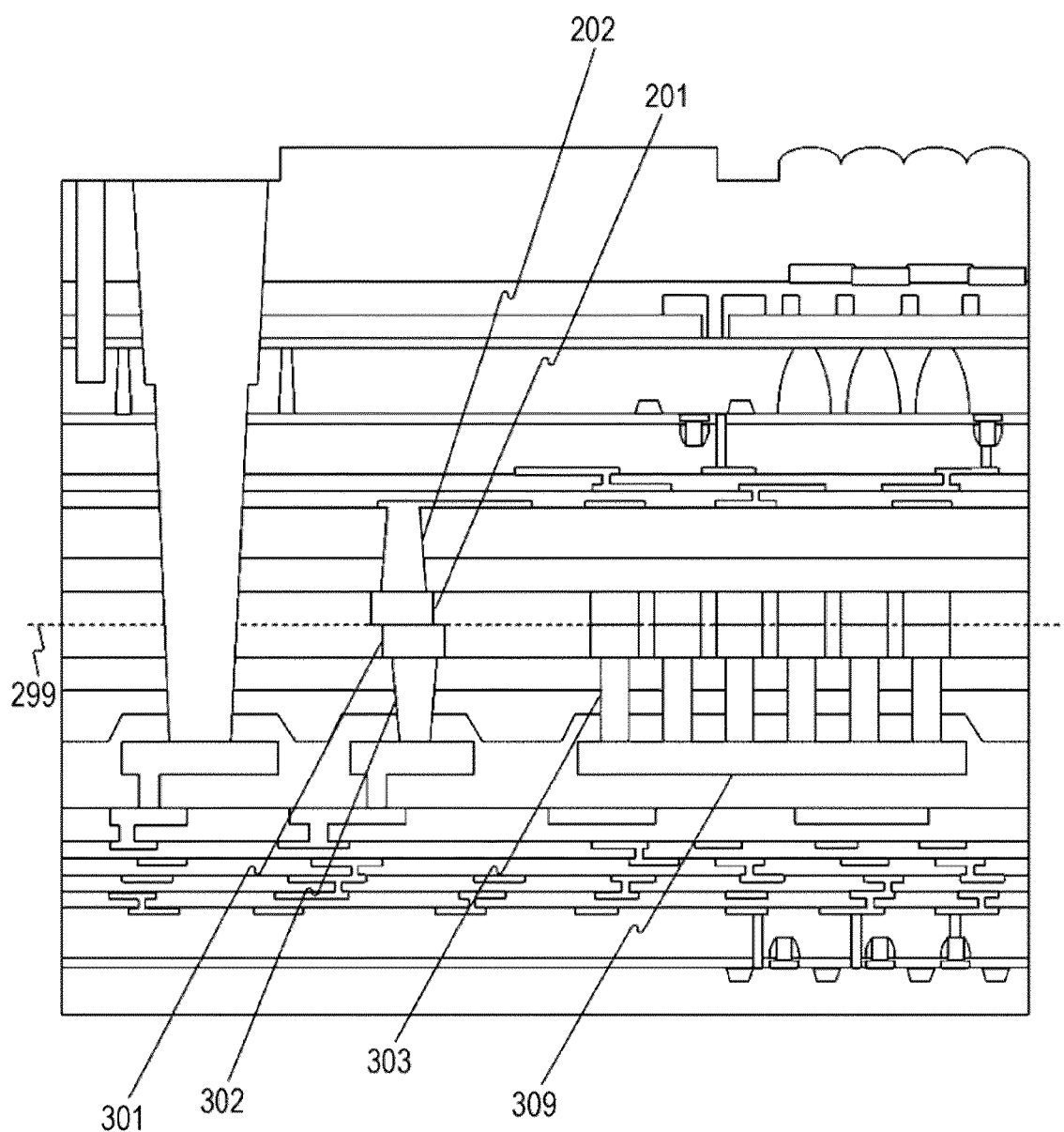

[Fig. 19]
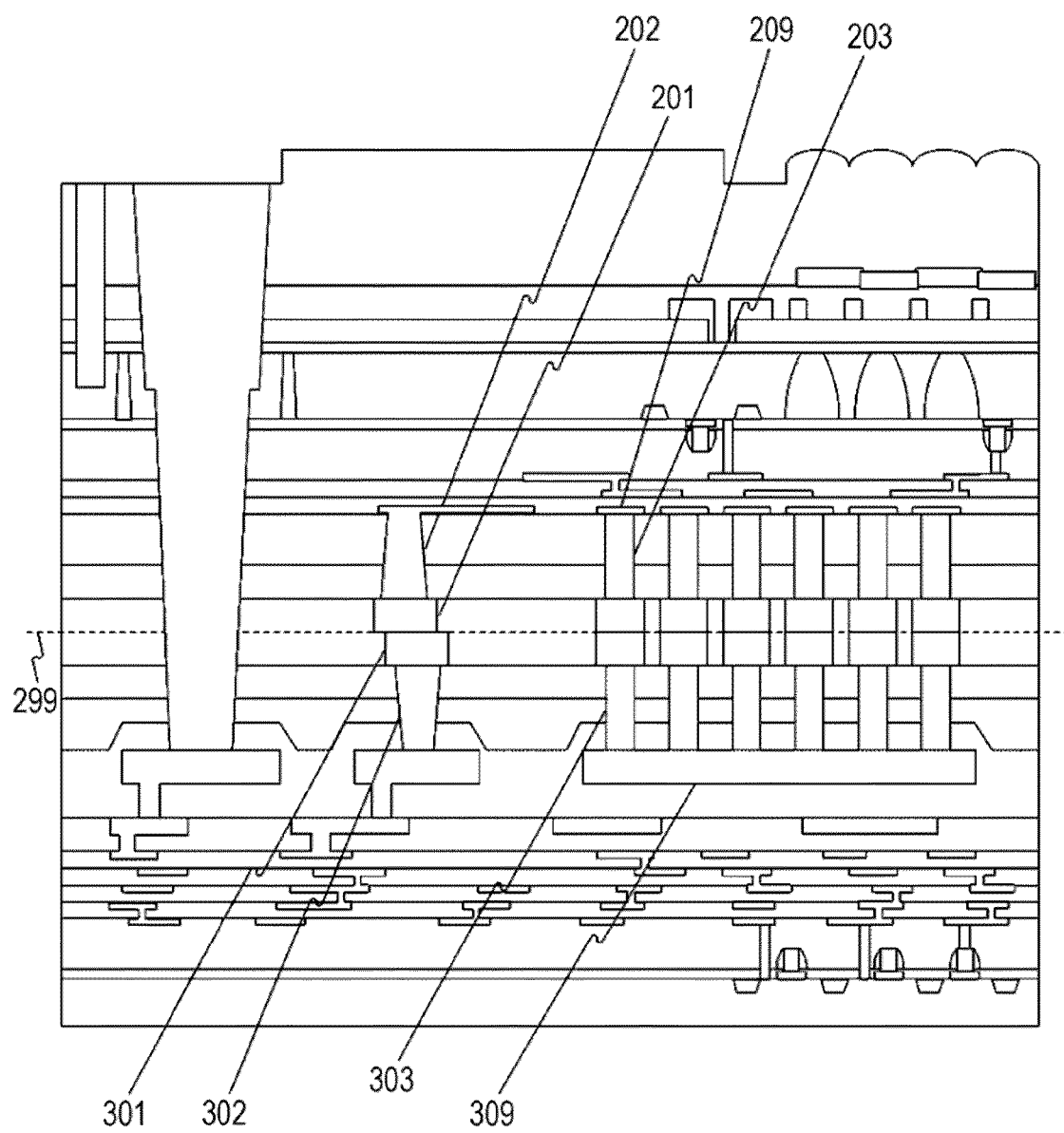

[Fig. 20]
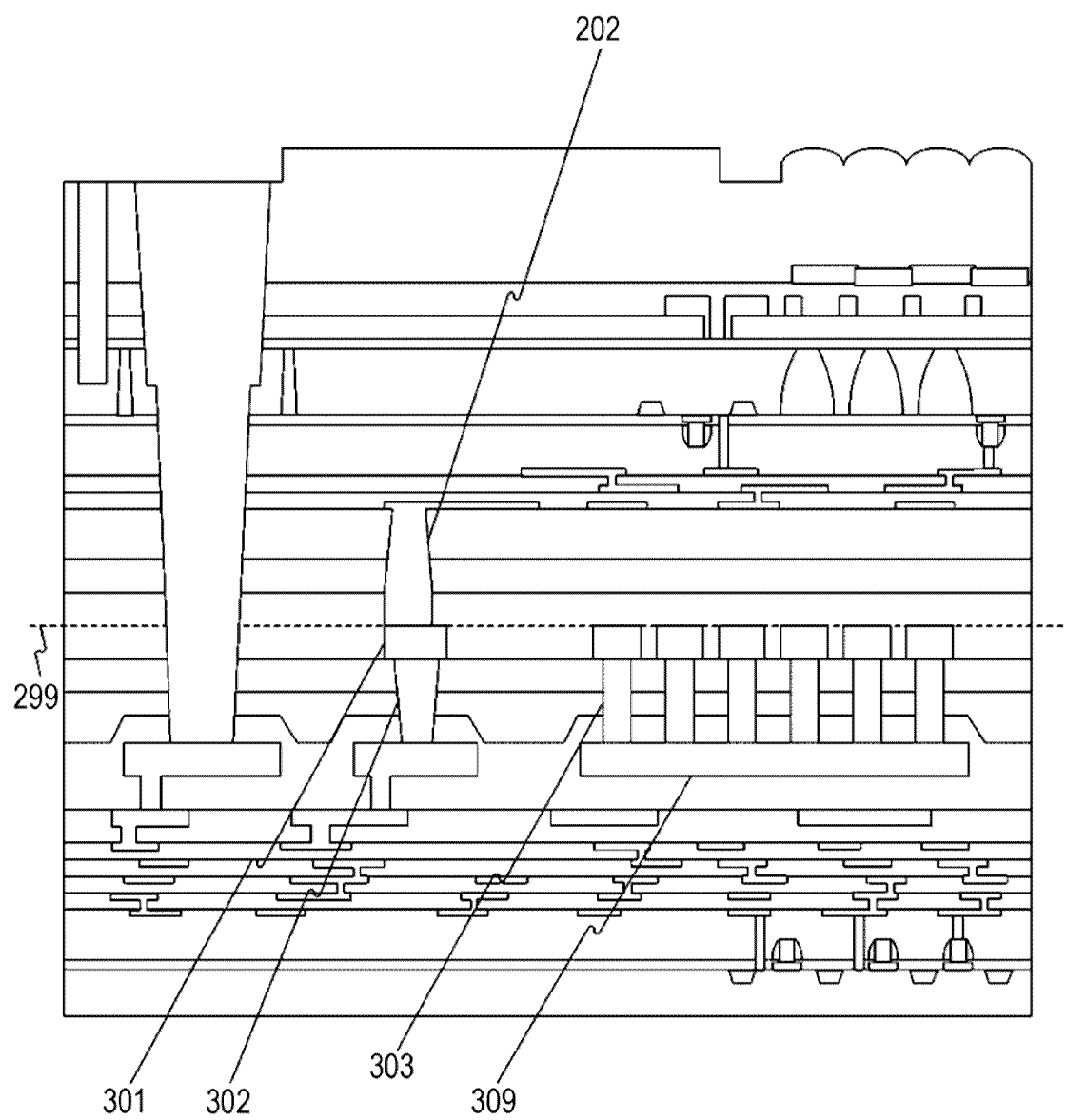

[Fig. 21]
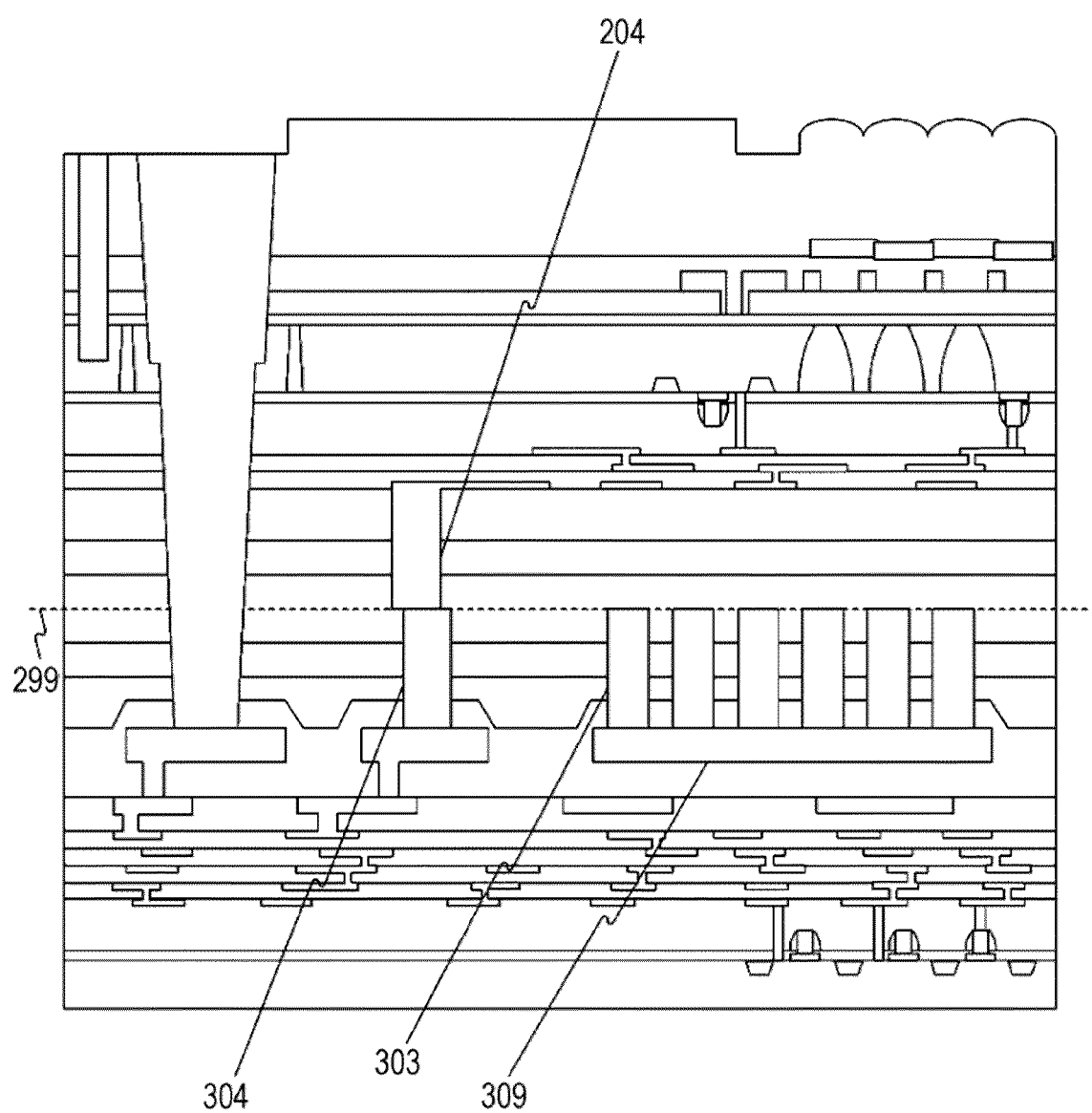

[Fig. 22]
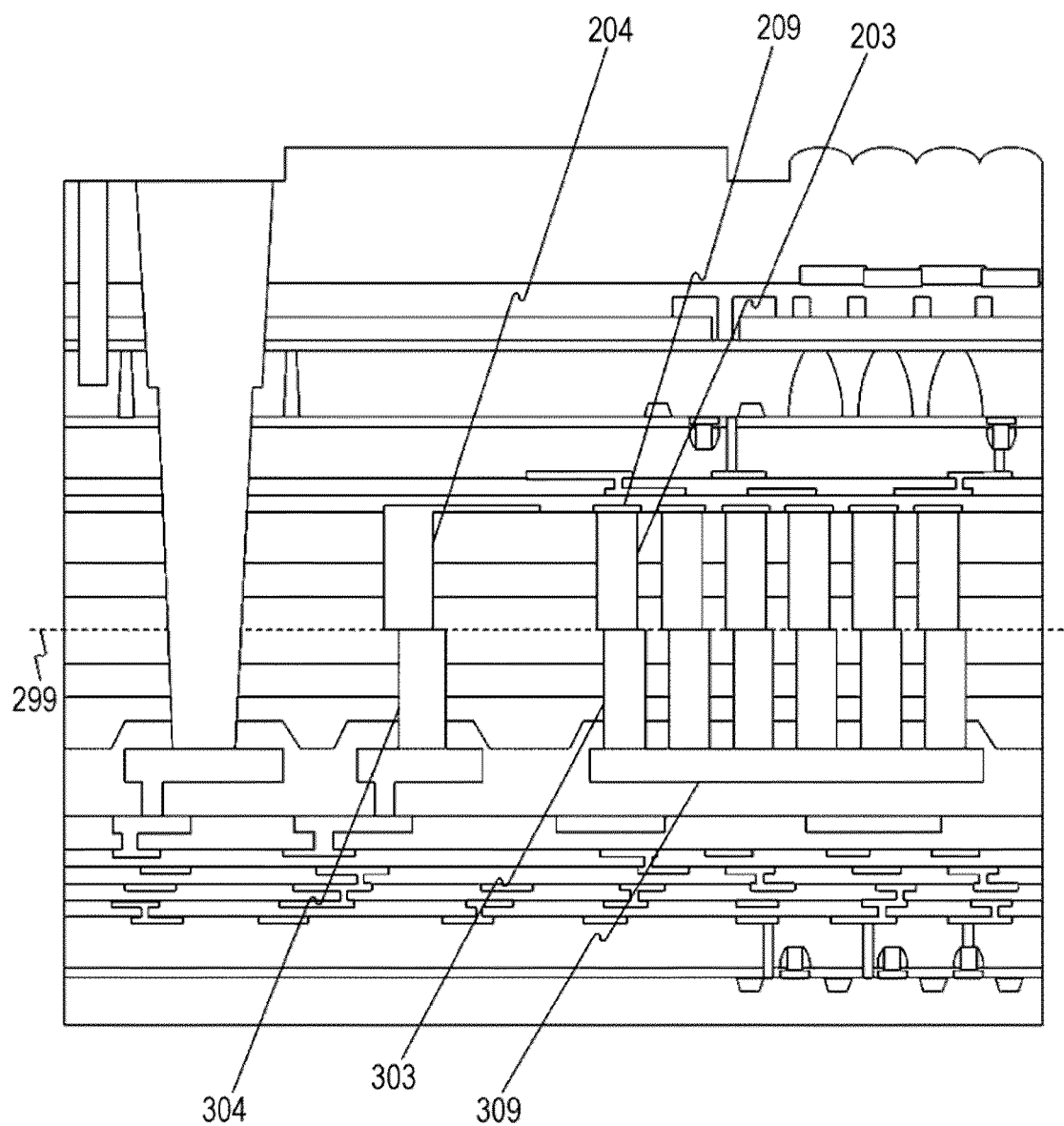

[Fig. 23]
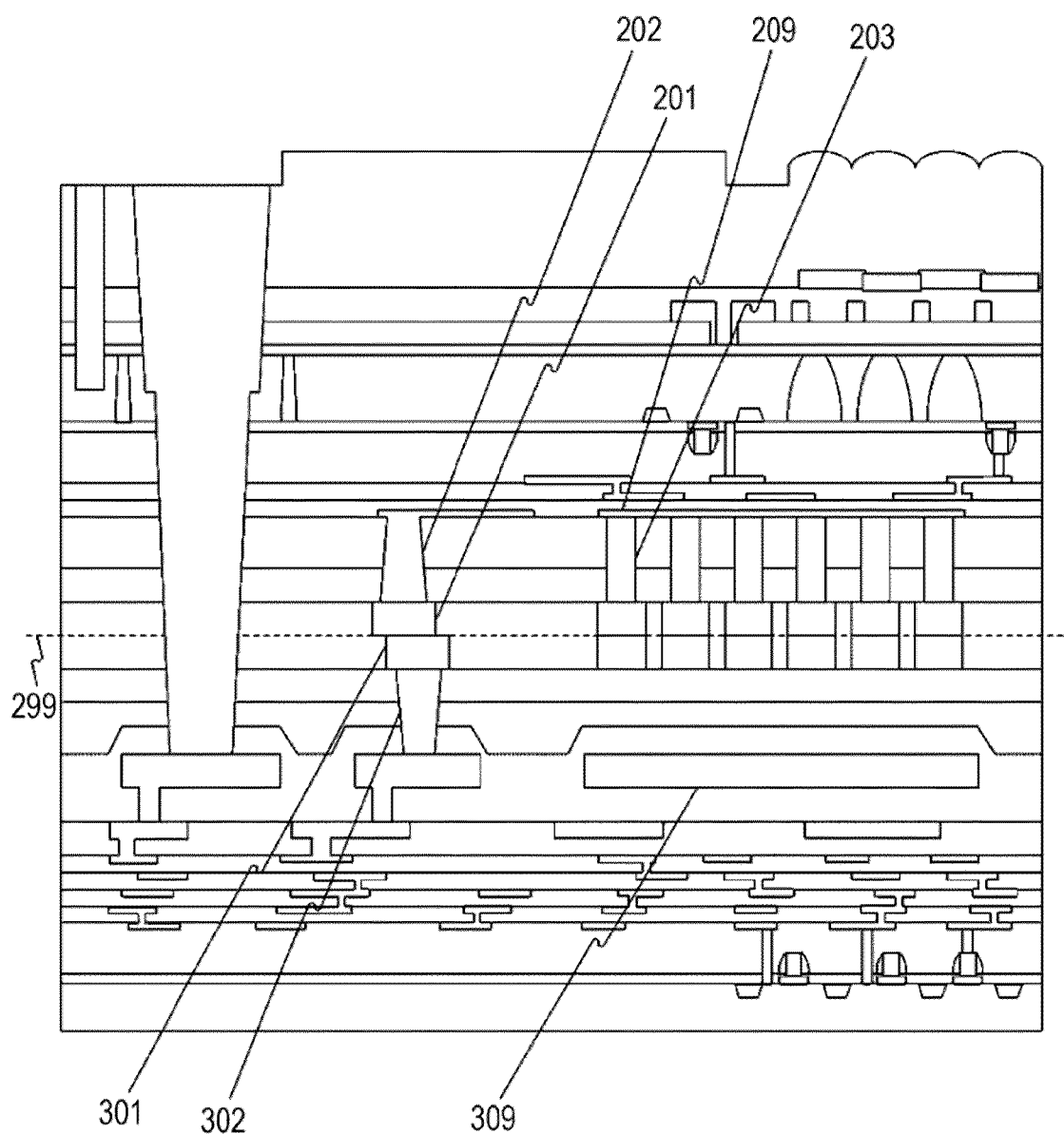

[Fig. 24]
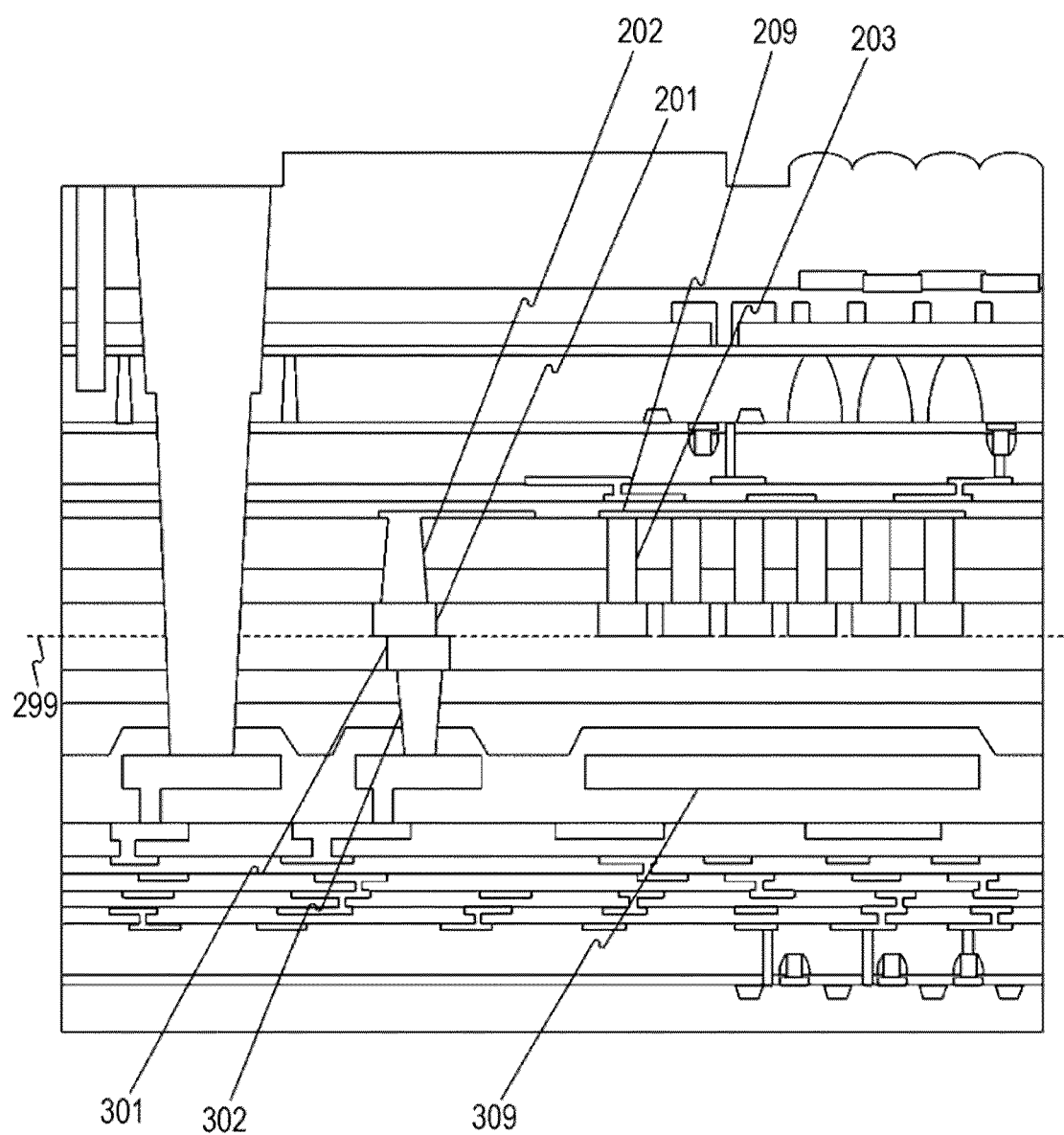

[Fig. 25]
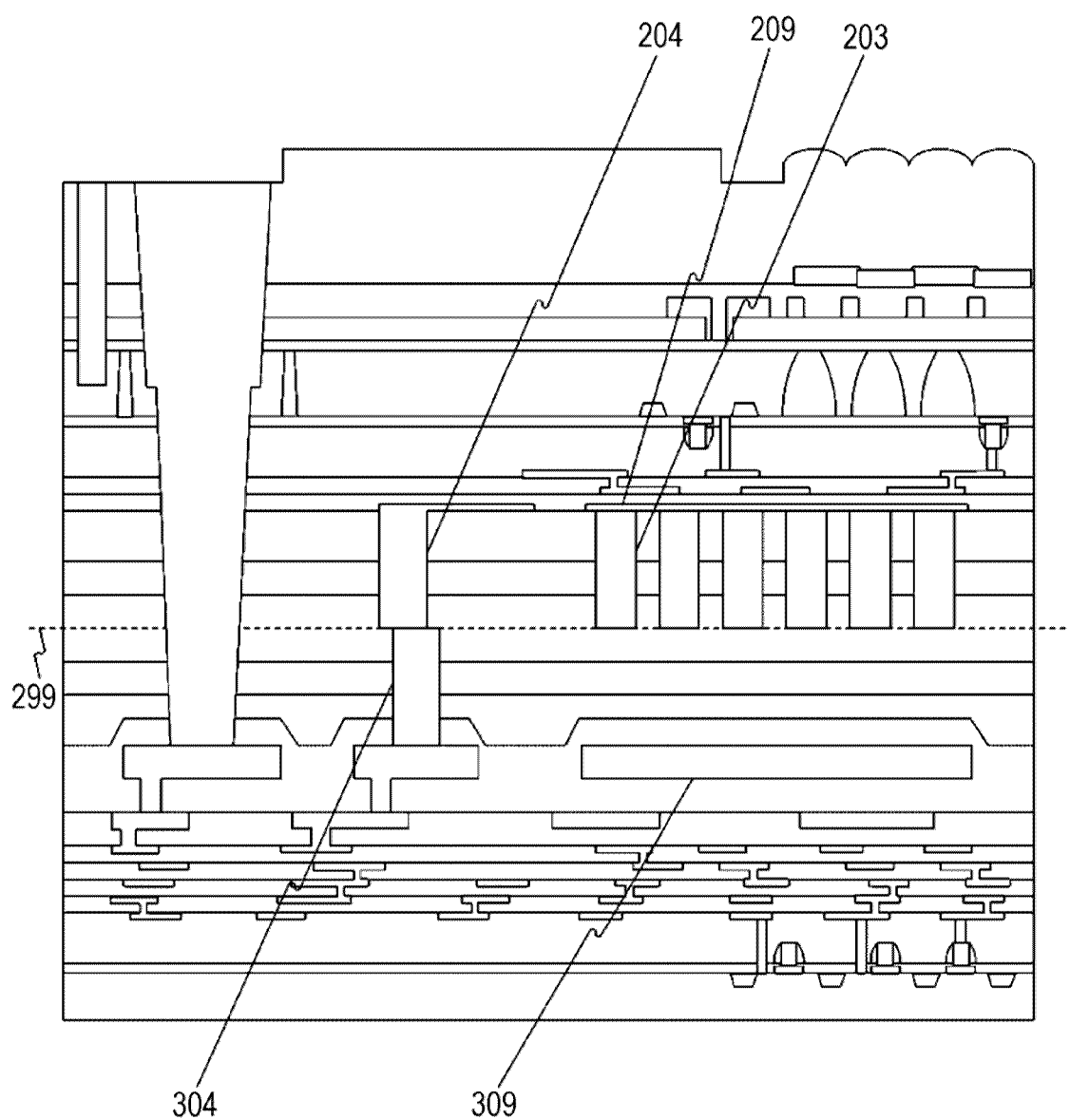

[Fig. 26]
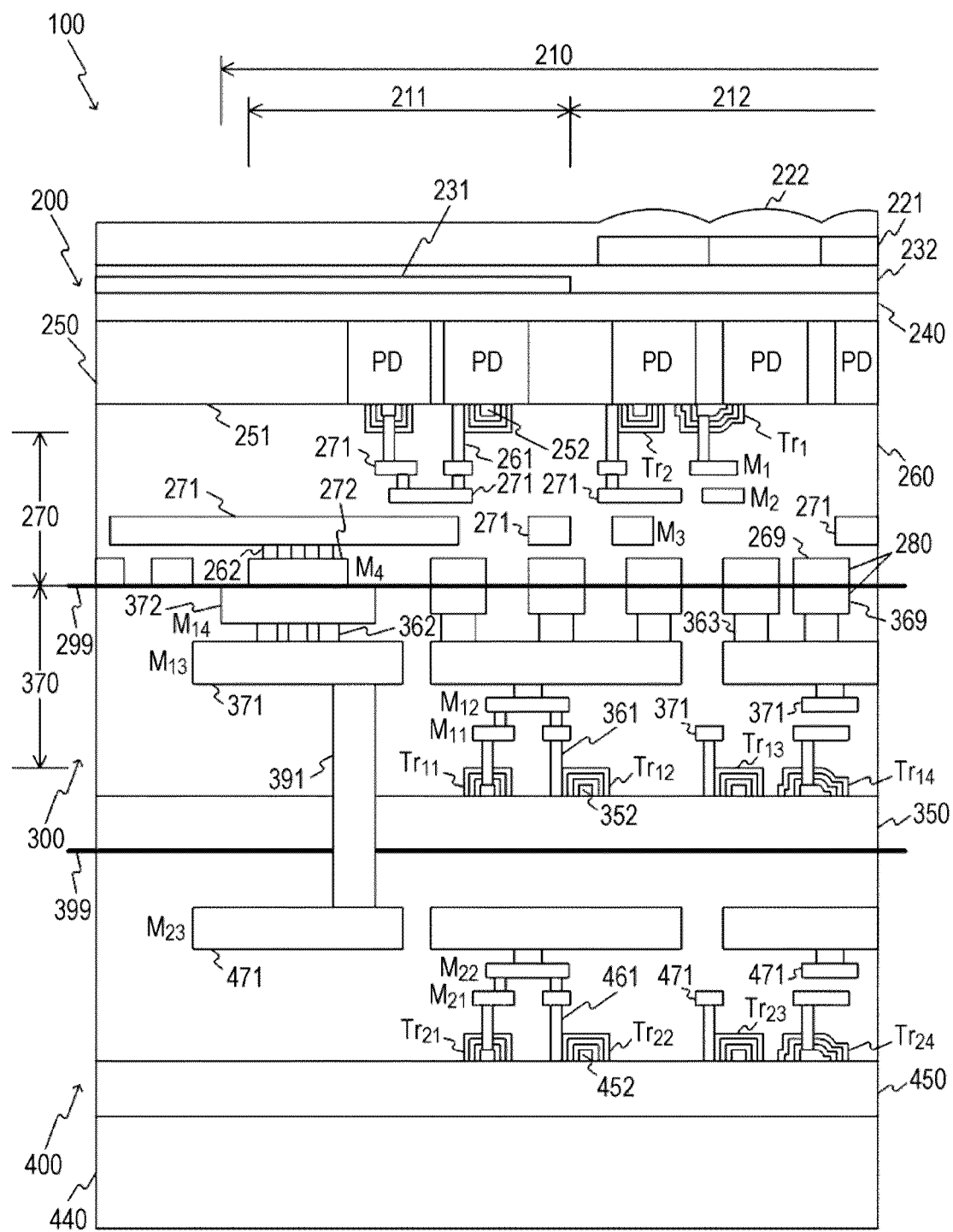

SEMICONDUCTOR DEVICE

CROSS REFERENCE TO RELATED APPLICATIONS

This application is a national stage application under 35 U.S.C. 371 and claims the benefit of PCT Application No. PCT/JP2018/024341 having an international filing date of 27 Jun. 2018, which designated the United States, which PCT application claimed the benefit of Japanese Priority Patent Application No. 2017-127504 filed on 29 Jun. 2017, the entire disclosures of each of which are incorporated herein by reference.

TECHNICAL FIELD

The present technology relates to a semiconductor device. More specifically, the present technology relates to a semiconductor device including a stacked semiconductor substrate in which multi-layer wiring layers of a plurality of semiconductor substrates are electrically connected.

BACKGROUND ART

In recent years, digital cameras are widely used more and more. Along with such a situation, demand for a solid-state imaging device (image sensor or imaging device) that is a central part of a digital camera is increased more and more. In terms of performance of the solid-state imaging device, technology has been developed in order to achieve higher image quality and advanced functions. On the other hand, portable terminals having an imaging function (such as a cellular phone, a personal digital assistant (PDA), a laptop personal computer (PC), and a tablet PC) are also widely used. Along with such a situation, miniaturization, weight reduction, and thinning of a solid-state imaging device and parts constituting the same are in progress in order to improve portability of these portable terminals. Furthermore, cost reduction of the solid-state imaging device and the parts constituting the same are also in progress in order to encourage broad use of these portable terminals.

Generally, in a solid-state imaging device (such as a metal oxide semiconductor (MOS) solid-state imaging device) has a configuration in which a photoelectric conversion unit, an amplifier circuit, and a multi-layer wiring layer are formed on a light receiving surface side of a silicon substrate and a color filter and an on-chip microlens are formed thereon. Additionally, a cover glass is pasted on the light receiving surface side with a spacer such as an adhesive. Also, a terminal is formed on an opposite side of the light receiving surface. A signal processing circuit to apply predetermined processing to an output signal is connected to this solid-state imaging device. As the number of functions in a solid-state imaging device is increased, processing performed in the signal processing circuit tends to be increased.

To miniaturize the configuration in which a plurality of semiconductor substrates is thus connected, various measures are taken. For example, a plurality of semiconductor substrates is sealed inside one package by a system in package (SiP) technology. Consequently, a mounting area can be reduced and an entire configuration can be miniaturized. However, according to the SiP, a transmission distance is elongated connecting by a wiring connecting semiconductor substrates, and high-speed operation may be hindered.

In contrast, proposed is a solid-state imaging device having a configuration in which a first semiconductor substrate including a pixel region and a second semiconductor substrate including a logic circuit are pasted and bonded to each other (refer to Patent Literature 1, for example). According to this configuration, a signal can be transmitted at a high speed. In this solid-state imaging device, the first semiconductor substrate including the pixel array and the second semiconductor substrate including the logic circuit, both of which are in a half-finished state, are pasted to each other, and the first semiconductor substrate is thinned, and then the pixel array and the logic circuit are connected. Here, such connection is achieved by forming a connection wiring including: a connection conductor connected to a wiring of the first semiconductor substrate; a penetration connection conductor penetrating the first semiconductor substrate and connected to a wiring of the second semiconductor substrate; and a coupling conductor to couple both of the connection conductors. After that, a finished-state product is made into a chip and formed as a back-illuminated type solid-state imaging device.

On the other hand, in a solid-state imaging device obtained by bonding a plurality of semiconductor substrates, proposed is a method in which copper (Cu) electrodes are taken out on surfaces of both of semiconductor substrates and then connected instead of the electrical connection method using a penetration connection conductor (refer to Patent Literature 2, for example). Additionally, proposed is a solid-state imaging device using a copper electrode as a light shielding layer (refer to Patent Literature 3, for example). With this configuration, light emission by a hot carrier from a transistor of a logic circuit is blocked by the light shielding layer, and light incidence on a pixel array side is suppressed. Additionally, a thickness of an entire semiconductor chip after bonding is also reduced.

CITATION LIST

Patent Literature

PTL 1: JP 2012-064709A
PTL 2: JP 2013-073988A
PTL 3: JP 2012-164870A

SUMMARY

Technical Problem

A coverage ratio of a copper electrode (an area ratio of a copper electrode in an area occupied by an insulation film and the copper electrode) is to be set to a certain level or higher in order to use a copper electrode as a light shielding layer like the related described above. However, in this case, a region that is not partly bonded may be generated when a first semiconductor wafer is bonded to a second semiconductor wafer, and a void may be formed. In a case where the void is formed, bonding strength at the portion is weak, and therefore, separation may be caused in a process of thinning a silicon substrate of the first semiconductor wafer performed after bonding the wafers. The reason why such a region that may not be bonded is generated is that a bonding wave rate at the timing of bonding the wafers becomes non-uniform by increasing a coverage ratio of the copper electrode. In other words, it can be considered that a portion where a bonding rate becomes relatively slow is generated at an outer peripheral portion of the wafer, and a region that may not be bonded, namely, a void (bubble) is formed. Thus, the reason why such a void is likely to be formed at the time of bonding the wafers in the case of setting the high coverage ratio of the copper is that materials facing each other at the time of bonding have weak bonding strength in regions where copper faces copper and copper faces an insulation film. As for the materials facing each other at the time of bonding, it is necessary to secure a ratio of a region where an insulation film faces an insulation film by suppressing a ratio of the copper to a certain level or less and increasing a ratio of the insulation film.

On the other hand, as an exemplary utilization of a conductive film formed in the vicinity of a bonding surface, a method of using the conductive film as a wiring layer of a logic circuit in a second semiconductor chip portion can be considered. Particularly, wiring resistance in an uppermost layer can be reduced by adopting a structure in which a wiring portion of the conductive film formed in the vicinity of the bonding surface is connected with a connection wiring to the uppermost wiring layer of the logic circuit. For this, it is advantageous that the conductive film in the vicinity of the bonding surface can be arranged with a high coverage ratio, but the coverage ratio of the conductive film is to be suppressed to 50% or less, for example, in order to suppress a bonding void, and the wiring is hardly efficiently utilized.

The present technology is created in view of the above-described situation, and it is desirable to reduce wiring resistance by utilizing a conductive film as a wiring layer while the conductive film existing in the vicinity of a bonding surface between a plurality of semiconductor chips is set to have a lower coverage ratio.

Solution to Problem

The present technology is made to solve the above-described problems, and according to a first aspect thereof, provided is an imaging device including a first substrate including a pixel array and a first multilayer wiring layer. The first multilayer wiring layer includes a first wiring that receives electrical signals based on electric charge generated by at least one photoelectric conversion unit; and a plurality of second wirings. The imaging device includes a second substrate including a second multilayer wiring layer and a logic circuit that processes the electrical signals. The second multilayer wiring layer includes a third wiring bonded to the first wiring; and a plurality of fourth wirings, at least one of the plurality of fourth wirings being bonded to at least one of the plurality of second wirings. The second multilayer wiring layer includes at least one fifth wiring that is connected to the plurality of fourth wirings and that receives a power supply signal, and the first wiring and the third wiring are closer to edges of the first and second substrates than the plurality of second wirings, the plurality of fourth wirings, and the at least one fifth wiring.

The second multilayer wiring layer further comprises a plurality of sixth wirings, one of the sixth wirings connected between the at least one fifth wiring and one of the plurality of second wirings or the plurality of fourth wirings.

A height and a width of each of the plurality of sixth wirings are different. For example, the width is greater than the height. The width of each of the plurality of sixth wirings is less than a width of each of the plurality of fourth wirings. The at least one fifth wiring is wider than the plurality of fourth wirings and the plurality of sixth wirings.

The first wiring is connected to a first conductive via in the first substrate, and the third wiring is connected to a second conductive via in the second substrate.

The first multilayer wiring layer further comprises a plurality of seventh wirings having respective first ends connected to respective ones of the plurality of second wirings. The first multilayer wiring layer further comprises a plurality of eighth wirings connected to respective second ends of the plurality of seventh wirings. A third substrate is bonded to the second substrate. The third substrate includes a memory.

According to an aspect of the present technology, an imaging device includes a first substrate including a first multilayer wiring layer. The first multilayer wiring layer includes a first wiring for bonding the first substrate to a second substrate and that receives electrical signals based on electric charge generated by at least one photoelectric conversion unit; a plurality of second wirings for bonding the first substrate to the second substrate; at least one third wiring that receives a power supply signal; and a plurality of fourth wirings that connect the at least one third wiring to the plurality of second wirings. The at least one third wiring is wider than the plurality of second wirings and the plurality of fourth wirings. The plurality of second wirings, the at least one third wiring, and the plurality of fourth wirings are located closer to at least a portion of a pixel region than the first wiring. The imaging device includes the second substrate including a second multilayer wiring layer and a logic circuit that processes the electrical signals. The second multilayer wiring layer includes a fifth wiring bonded to the first wiring; and a plurality of sixth wirings bonded to the plurality of second wirings. The plurality of second wirings, the at least one third wiring, and the plurality of fourth wirings overlap the portion of the pixel region. The second multilayer wiring layer further comprises a plurality of seventh wirings located at a different level in the second multilayer wiring layer than the plurality of sixth wirings; and a plurality of eighth wirings connected between the plurality of seventh wirings and the plurality of sixth wirings. The plurality of seventh wirings are wider than the plurality of eighth wirings. The fifth wiring and the first wiring are closer to edges of the first and second substrates than the plurality of second wirings and the plurality of sixth wirings. The first wiring is connected to a first conductive via, and the fifth wiring is connected to a second conductive via. The imaging device includes a third substrate bonded to the second substrate. The third substrate includes a memory.

According to an aspect of the present technology, an imaging device includes a first substrate including a pixel array and a first multilayer wiring layer. The first multilayer wiring layer includes a first wiring that receives electrical signals based on electric charge generated by at least one photoelectric conversion unit; and a plurality of second wirings. The imaging device includes a second substrate including a second multilayer wiring layer and a logic circuit that processes the electrical signals. The second multilayer wiring layer includes a third wiring bonded to the first wiring; and a plurality of fourth wirings bonded to the plurality of second wirings. The first wiring and the third wiring are closer to edges of the first and second substrates than the plurality of second wirings, the plurality of fourth wirings, and the at least one fifth wiring. In a plan view, the plurality of fourth wirings and the plurality of second wirings overlap at least a portion of a pixel region of the pixel array. The second multilayer wiring layer includes at least one fifth wiring that is connected to the plurality of fourth wirings, and the at least one fifth wiring receives a power supply signal. The second substrate includes a plurality of sixth wirings that connect the at least one fifth wiring to the plurality of fourth wirings.

Advantageous Effects of Invention

According to an embodiment of the present technology, it is possible to achieve an excellent effect in which wiring resistance can be reduced by utilizing a conductive film as a wiring layer while the conductive film existing in the vicinity of the bonding surface between the plurality of semiconductor chips is set to have a low coverage ratio. Note that the effect recited herein is not necessarily limited and may be any one of those recited in the present disclosure.

BRIEF DESCRIPTION OF DRAWINGS

FIG. 1 is a diagram illustrating an exemplary configuration of a solid-state imaging device that is an example of a semiconductor device having an imaging element according to an embodiment of the present technology.

FIGS. 2A-2C are diagrams illustrating exemplary division of substrates of the solid-state imaging device according to the embodiment of the present technology.

FIG. 3 is a cross-sectional view illustrating an exemplary solid-state imaging device according to the embodiment of the present technology.

FIG. 4 is a view illustrating an example of details of a first semiconductor substrate according to the embodiment of the present technology.

FIG. 5 is a view illustrating an example of details of a second semiconductor substrate according to the embodiment of the present technology.

FIGS. 6A-8B are views illustrating an exemplary structure of an intermediate wiring between a connection wiring and a wiring according to the embodiment of the present technology.

FIGS. 7A-7C are diagrams illustrating first exemplary shapes of the intermediate wiring on a plane of the wiring according to the embodiment of the present technology.

FIGS. 8A-8B are views illustrating second exemplary shapes of the intermediate wiring on the plane of the wiring according to the embodiment of the present technology.

FIG. 9 is a view illustrating a first process in an exemplary manufacturing method for a solid-state imaging device according to the embodiment of the present technology.

FIG. 10 is a view illustrating a second process in the exemplary manufacturing method for a solid-state imaging device according to the embodiment of the present technology.

FIG. 11 is a view illustrating a third process in the exemplary manufacturing method for a solid-state imaging device according to the embodiment of the present technology.

FIG. 12 is a view illustrating a fourth process in the exemplary manufacturing method for a solid-state imaging device according to the embodiment of the present technology.

FIG. 13 is a view illustrating a fifth process in the exemplary manufacturing method for a solid-state imaging device according to the embodiment of the present technology.

FIG. 14 is a view illustrating a sixth process in the exemplary manufacturing method for a solid-state imaging device according to the embodiment of the present technology.

FIG. 15 is a view illustrating a seventh process in the exemplary manufacturing method for a solid-state imaging device according to the embodiment of the present technology.

FIG. 16 is a view illustrating an eighth process in the exemplary manufacturing method for a solid-state imaging device according to the embodiment of the present technology.

FIG. 17 is a view illustrating a ninth process in the exemplary manufacturing method for a solid-state imaging device according to the embodiment of the present technology.

FIG. 18 is a cross-sectional view of a solid-state imaging device according to a first modified example of the embodiment of the present technology.

FIG. 19 is a cross-sectional view of a solid-state imaging device according to a second modified example of the embodiment of the present technology.

FIG. 20 is a cross-sectional view of a solid-state imaging device according to a third modified example of the embodiment of the present technology.

FIG. 21 is a cross-sectional view of a solid-state imaging device according to a fourth modified example of the embodiment of the present technology.

FIG. 22 is a cross-sectional view of a solid-state imaging device according to a fifth modified example of the embodiment of the present technology.

FIG. 23 is a cross-sectional view of a solid-state imaging device according to a sixth modified example of the embodiment of the present technology.

FIG. 24 is a cross-sectional view of a solid-state imaging device according to a seventh modified example of the embodiment of the present technology.

FIG. 25 is a cross-sectional view of a solid-state imaging device according to an eighth modified example of the embodiment of the present technology.

FIG. 26 is a cross-sectional view of a solid-state imaging device according to a ninth modified example of the embodiment of the present technology.

DESCRIPTION OF EMBODIMENTS

In the following, a mode to implement the present technology (hereinafter referred to as "embodiment") will be described below. The description will be provided in the following order.

1. Embodiment
2. Modified Examples

1. EMBODIMENT

Configuration of Solid-State Imaging Device

FIG. 1 is a diagram illustrating an exemplary configuration of a solid-state imaging device that is an example of a semiconductor device having an imaging element according to an embodiment of the present technology. The solid-state imaging device is formed as a complementary metal oxide semiconductor (CMOS) image sensor. This solid-state imaging device has an imaging element 10 and a peripheral circuit portion on a semiconductor substrate (not illustrated) (e.g., silicon substrate). The peripheral circuit portion includes a vertical drive circuit 20, a horizontal drive circuit 30, a control circuit 40, a column signal processing circuit 50, and an output circuit 60.

The imaging element 10 is a pixel array in which a plurality of pixels 11 each including a photoelectric conversion unit is arranged like a two-dimensional array. The pixel 11 includes, for example: a photodiode to be a photoelectric conversion unit; and a plurality of pixel transistors. Here, the plurality of pixel transistors can include three transistors such as a transfer transistor, a reset transistor, and an amplification transistor. Additionally, the plurality of pixel transistors can include four transistors by adding a selection transistor. Note that an equivalent circuit of a unit pixel is similar to a general circuit, and therefore, a detailed description thereof will be omitted.

Furthermore, the pixel 11 can be formed as one unit pixel or can have a shared pixel structure. In this pixel sharing structure, another transistor other than a floating diffusion and a transfer transistor is shared by a plurality of photodiodes.

The vertical drive circuit 20 drives the pixels 11 in a row unit. The vertical drive circuit 20 includes, for example, a shift register. The vertical drive circuit 20 selects a pixel drive wiring, and supplies the selected pixel drive wiring with a pulse in order to drive a pixel 11. Consequently, the vertical drive circuit 20 selectively, sequentially and vertically scans each of the pixels 11 in a row unit in the imaging element 10, and supplies the column signal processing circuit 50 with a pixel signal based on signal charge generated in accordance with a received light amount in the photoelectric conversion unit in each of the pixel 11.

The horizontal drive circuit 30 drives a column signal processing circuit 50 in a column unit. The horizontal drive circuit 30 includes, for example, a shift register. The horizontal drive circuit 30 sequentially selects each of the column signal processing circuits 50 by sequentially outputting horizontal scanning pulses, and causes each of column signal processing circuits 50 to output a pixel signal to a horizontal signal line 59.

The control circuit 40 controls the entire solid-state imaging device. The control circuit 40 receives an input clock and data to command an operation mode and the like, and also outputs data such as internal information of the solid-state imaging device. More specifically, the control circuit 40 generates a clock signal and a control signal to be reference of operation of the vertical drive circuit 20, column signal processing circuit 50, horizontal drive circuit 30, and the like on the basis of a vertical synchronization signal, a horizontal synchronization signal, and a master clock. Then, these signals are received in the vertical drive circuit 20, column signal processing circuit 50, horizontal drive circuit 30, and the like.

The column signal processing circuit 50 is arranged, for example, per column of the pixels 11 and applies, per pixel column, signal processing such as noise removal for signals output from the pixels 11 of one row. More specifically, the column signal processing circuit 50 performs signal processing such as correlated double sampling (CDS), signal amplification, and analog/digital (AD) conversion in order to remove fixed pattern noise peculiar to the pixels 11. An output stage of the column signal processing circuit 50 has a horizontal selection switch (not illustrated) connected on the way to the horizontal signal line 59.

The output circuit 60 applies signal processing to a signal sequentially supplied from each of the column signal processing circuits 50 via the horizontal signal line 59, and outputs the signal subjected to the signal processing. At this point, the output circuit 60 buffers the signal from the column signal processing circuit 50. Additionally, the output circuit 60 may apply, to the signal from the column signal processing circuit 50, various kinds of digital signal processing such as black level adjustment and column variation correction.

FIG. 2 is a diagram illustrating exemplary division of substrates of the solid-state imaging device according to the embodiment of the present technology.

In the drawing, "a" illustrates a first example. The first example includes a first semiconductor substrate 91 and a second semiconductor substrate 92. A pixel region 93 and a control circuit 94 are mounted on the first semiconductor substrate 91. A logic circuit 95 including a signal processing circuit is mounted on the second semiconductor substrate 92. Then, the first semiconductor substrate 91 and the second semiconductor substrate 92 are electrically connected to each other, thereby forming a solid-state imaging device as one semiconductor chip.

In the drawing, "b" illustrates a second example. The second example includes a first semiconductor substrate 91 and a second semiconductor substrate 92. A pixel region 93 is mounted on the first semiconductor substrate 91. A control circuit 94 and a logic circuit 95 including a signal processing circuit are mounted on the second semiconductor substrate 92. Then, the first semiconductor substrate 91 and the second semiconductor substrate 92 are electrically connected to each other, thereby forming a solid-state imaging device as one semiconductor chip.

In the drawing, "c" illustrates a third example. The third example includes a first semiconductor substrate 91 and a second semiconductor substrate 92. A pixel region 93 and a control circuit 94 that controls the pixel region 93 are mounted on the first semiconductor substrate 91. A logic circuit 95 including a signal processing circuit and a control circuit 94 that controls the logic circuit 95 are mounted on the second semiconductor substrate 92. Then, the first semiconductor substrate 91 and the second semiconductor substrate 92 are electrically connected to each other, thereby forming a solid-state imaging device as one semiconductor chip.

Exemplary Configuration of Solid-State Imaging Device

FIG. 3 is a cross-sectional view illustrating an exemplary solid-state imaging device (or imaging device) 100 according to the embodiment of the present technology. The solid-state imaging device 100 is a back-illuminated type CMOS solid-state imaging element, has a light receiving portion arranged on an upper portion of a circuit portion, and is characterized in having higher sensitivity and lower noise than a front-illuminated type does.

The solid-state imaging device 100 includes a stacked semiconductor chip in which a first semiconductor substrate 200 having a pixel array and a control circuit formed thereon and a second semiconductor substrate 300 having a logic circuit formed thereon are pasted to each other like the above-described first semiconductor substrate 91 and second semiconductor substrate 92. The first semiconductor substrate 200 and the second semiconductor substrate 300 are pasted to each other such that multi-layer wiring layers described later face each other and connection wirings are directly bonded. Note that the first semiconductor substrate 200 and the second semiconductor substrate 300 are examples of a plurality of semiconductor substrates specified in the claims.

In the first semiconductor substrate 200, formed is a pixel array 210 on which a plurality of pixels each including a photodiode PD serving as a photoelectric conversion unit and a plurality of pixel transistors Tr1 and Tr2 is two-dimensionally arrayed on the semiconductor substrate 250 including thinned silicon. Note that the pixel transistors Tr1 and Tr2 represent a plurality of pixel transistors. Furthermore, a plurality of MOS transistors constituting a control circuit (not illustrated) is formed on the semiconductor substrate 250.

On a front surface 251 side of the semiconductor substrate 250, a multi-layer wiring layer 270 where a plurality of, in this example, wirings 271 (M1 to M3) and 272 (M4) including four-layer metals M1 to M4 is arranged via an interlayer insulation film 260 is formed. As the wirings 271 and 272, copper (Cu) wirings formed by a dual damascene process are used.

On a back surface side of the semiconductor substrate 250, a light shielding film 231 including an optical black region (or peripheral region) 211 is formed via an insulation film 240, and furthermore, a color filter 221 and an on-chip lens 222 are formed on an effective pixel array 212 via a flattened film 232. An on-chip lens can be formed also on the optical black region 211.

In the second semiconductor substrate 300, a logic circuit 310 constituting a peripheral circuit is formed on a semiconductor substrate 350 including silicon. The logic circuit 310 is formed by using a plurality of MOS transistors Tr11 to Tr14 including a CMOS transistor. Here, a plurality of MOS transistors of the logic circuit 310 is represented by the MOS transistors Tr11 to Tr14.

FIG. 4 is a view illustrating an example of details of the first semiconductor substrate 200 according to the embodiment of the present technology. In the first semiconductor substrate 200, a photodiode PD is formed on the thinned semiconductor substrate 250. The photodiode PD is includes, for example, an N-type semiconductor region 253 and a P-type semiconductor region 254 located on the front surface side of the substrate. A gate electrode 252 is formed on a substrate surface constituting a pixel via a gate insulation film, and each of the pixel transistors Tr1 and Tr2 is formed with a source/drain region 256 paired with the gate electrode 252.

The pixel transistor Tr1 adjacent to the photodiode PD corresponds to a floating diffusion FD. Each unit pixel is separated by an element separation region 257. The element separation region 257 is formed to have, for example, a shallow trench isolation (STI) structure in which an insulation film such as a silicon oxide film (SiO2 film) is embedded in a groove formed in the substrate.

In the multi-layer wiring layer 270 of the first semiconductor substrate 200, a pixel transistor and a wiring 271 corresponding to each other, and adjacent upper and lower wirings 271 are connected via a conductive via 261. Furthermore, a connection wiring (or wiring) 269 made by using a fourth-layer metal M4 is formed in a manner facing a bonding surface 299 to be bonded to the second semiconductor substrate 300. The connection wiring 269 is connected to a wiring 271 made by using a third-layer metal M3 via the conductive via 261.

FIG. 5 is a view illustrating an example of details of the second semiconductor substrate 300 according to the embodiment of the present technology. In the second semiconductor substrate 300, a multi-layer wiring layer 370 on which a plurality of layers, in this example, wirings 371 (M11 to M13) and 372 (M14) including four-layer metals M11 to M14 is arranged via an interlayer insulation film 360 is formed on the front surface side of the semiconductor substrate 350. As the wirings 371 and 372, copper (Cu) wirings formed by the dual damascene process are used.

In the second semiconductor substrate 300, each of MOS transistors Tr11 and Tr12 includes a gate electrode 352 via a pair of source/drain regions 356 and a gate insulation film in a semiconductor well region on the front surface side of the semiconductor substrate 350. Each of the MOS transistors Tr11 and Tr12 is separated by, for example, an element separation region 357 having an STI structure.

In the multi-layer wiring layer 370 of the second semiconductor substrate 300, the MOS transistors Tr11 to Tr14 and the wiring 371 and adjacent upper and lower wirings 371 are connected via a conductive via 361. Furthermore, the connection wiring (or wiring) 369 of a fourth-layer metal M14 is formed in a manner facing the bonding surface 299 to be bonded to the first semiconductor substrate 200. The connection wiring 369 is connected to a wiring 371 of a third-layer metal M13 the conductive via 361.

The first semiconductor substrate 200 and the second semiconductor substrate 300 are electrically connected by directly bonding the connection wirings 272 and 372 both facing the bonding surface 299 in a manner the multi-layer wiring layers 270 and 370 facing each other. Each of the interlayer insulation films 260 and 360 located in the vicinity of the bonding area is formed, as described in a manufacturing method described later, by combining: an insulation film having a Cu diffusion barrier property to prevent (or alternatively, reduce) Cu diffusion in a Cu wiring; and an insulation film not having a Cu diffusion barrier property. Direct bonding between the connection wirings 272 and 372 obtained by using the Cu wirings is performed by thermal diffusion bonding. Bonding between the interlayer insulation films 260 and 360 other than between the connection wirings 272 and 372 is performed by plasma bonding or an adhesive.

As described above, besides the method of directly bonding the connection wirings 272 and 372 both facing the bonding surface 299, it may also be possible to adopt, for example, a method in which an extremely thin uniform insulation thin film is deposited on each of surfaces of the multi-layer wiring layers 270 and 370, and the insulation thin films are bonded by plasma bonding or the like.

Additionally, in the embodiment of the present technology, particularly, a bonding surface wiring 280 is formed in the vicinity of the bonding portion between the first semiconductor substrate 200 and the second semiconductor substrate 300 by connecting conductive films (connection wirings 269 and 369) in the same layer as the connection wiring. The bonding surface wiring 280 is connected, via a trench-shaped intermediate wiring 363, to the wiring 371 located in the metal M13 positioned in the second semiconductor substrate 300, and has a wiring function having the same potential. Note that the connection wirings 269 and 369 are examples of conductors specified in the claims. Furthermore, the intermediate wiring 363 is an example of a connection wiring specified in the claims. As shown in FIG. 3, wirings 272/372 are closer to edges of the first and second semiconductor substrates 200/300 than the wirings 269/369. For example, wirings 269/369 overlap the pixel region 212 while wirings 272/372 overlap the peripheral region 211. Alternatively, it should be understood that example embodiments encompass a case where the wirings 269/369 do not overlap the pixel region 212.

FIG. 6 is a view illustrating an exemplary structure of the intermediate wiring 363 between the connection wiring 369 and the wiring 371 according to the embodiment of the present technology. Here, assumed is a structure in which a wiring on the bonding surface is connected to a power supply line having a large width. The power supply line may supply power for logic of the second semiconductor substrate 300 (e.g., Tr11, Tr12, etc.) and/or for one or more elements of the first semiconductor substrate 200, for example, drive circuit 20 or 30 (e.g., using 209 of FIG. 19).

In the drawing, "b" illustrates a comparative example in the related art, and an occupied ratio (coverage ratio) of a bonding surface wiring is high and a bonding void may be caused. Furthermore, as a shape of the connection wiring between a conductive film and a wiring layer on this premise, a square, a circle or the like having an aspect ratio of 1 is assumed.

In the present embodiment, as illustrated in the "a" of the drawing, the portion of the bonding surface wiring 280 is formed thin in the wiring direction, and a plurality thereof each having the same potential is arranged on the one wiring 371. With this structure, a ratio of the insulation film on the bonding surface 299 is increased and set to an occupied ratio at which no bonding void is generated.

Furthermore, a shape of the intermediate wiring 363 between the connection wiring 369 and the wiring 371 is formed in a trench-like shape on the surface of the wiring 371. In other words, the aspect ratio of the shape on a plane of the connection wiring is not 1. With this structure, the intermediate wiring 363 also functions as a current path 12, and therefore, wiring resistance can be reduced while the bonding surface 299 is set to have a low coverage ratio.

Here, the coverage ratio is an area ratio of the connection wiring 369 in an area occupied by the interlayer insulation film 260 and the connection wiring 369 on the bonding surface 299. In order to prevent (or alternatively, reduce) a void from being formed, it is preferable that the coverage ratio of the bonding surface 299 be lower than about 50%. However, it can be considered that practical utilization is possible with the coverage ratio up to about 70%.

FIGS. 7 and 8 are diagrams illustrating exemplary shapes of the intermediate wiring 363 on the plane of the wiring 371 in the embodiment of the present technology.

A connection wiring used in a general multi-layer wiring technology has a shape in which an aspect ratio between a lateral length x and a vertical length y is approximately 1. In contrast, the intermediate wiring 363 in the embodiment of the present technology has a rectangular shape, a polygonal shape, or an elliptical shape having the aspect ratio larger than 1 as illustrated in the drawings. In other words, the intermediate wiring 363 is made to function as a current path having low wiring resistance while a ratio of an insulation film on the bonding surface 299 is increased by narrowing the shape of the intermediate wiring 363 in the wiring direction. Therefore, preferably, the aspect ratio of 2 or more be secured because there is an effect of achieving a higher wiring function.

Meanwhile, the laterally long shape is described as the exemplary shape having the aspect ratio larger than 1, but a vertically long shape may also be applicable. However, a thin long shape in a direction of an assumed current path is preferable in the viewpoint of the above-mentioned effects.

Additionally, as illustrated in FIG. 8, a connection wiring formed by combining rectangles each having the aspect ratio other than 1 may also be applicable. In other words, in a case where any one of respective rectangles has a shape having an aspect ratio larger than 1 before combination, it can be considered to form the connection wiring having a shape in accordance with the purpose of the embodiment of the present technology by combining a plurality thereof.

In the embodiment of the present technology, the above-described shape having the aspect ratio other than 1 will be referred to as a trench-like shape.

Manufacturing Method for Solid-State Imaging Device

FIGS. 9 to 17 are views illustrating an exemplary manufacturing method for a solid-state imaging device according to an embodiment of the present technology. Meanwhile, the illustrations are provided omitting a process on the first semiconductor substrate 200 side having the pixel array and a process on the second semiconductor substrate 300 side having the logic circuit.

First, as illustrated in FIG. 9, a semiconductor well region is formed in a region to be each semiconductor chip portion of the semiconductor substrate 250, and a photodiode PD to be a photoelectric conversion unit of each pixel is formed in this semiconductor well region. The above-described element separation region 257 (not illustrated) can be initially formed in advance. Each photodiode PD is formed in a manner extending in a depth direction of the semiconductor well region. The photodiode PD is formed in the effective pixel array (or pixel region) 212 and the optical black region 211 constituting the pixel array 210.

Additionally, a plurality of pixel transistors constituting each pixel is formed on a front surface 251 side of the semiconductor well region. The pixel transistors can include, for example, a transfer transistor, a reset transistor, an amplification transistor, and a selection transistor. Here, as described above, the pixel transistors Tr1 and Tr2 are illustrated as representatives. Each of the pixel transistors Tr1 and Tr2 includes a pair of source/drain regions and a gate electrode formed via a gate insulation film.

A plurality of layers, in this example, wirings 271 including three-layer metals M1 to M3 are formed including a conductive via 261 via the interlayer insulation film 260 on an upper portion on the front surface 251 side of the semiconductor substrate 250. The wirings 271 can be formed by the dual damascene process. In other words, a connection wiring formed by a via-first process and a wiring gutter are formed at the same time in the interlayer insulation film 260, a metal film having a Cu diffusion barrier property to prevent (or alternatively, reduce) diffusion of Cu and a Cu seed film are formed, and then a Cu material layer is embedded by a plating process. Examples of the metal film having a Cu diffusion barrier property can include Ta, TaN, Ti, TiN, W, WN, Ru, TiZrN, and an alloy film containing the same. Subsequently, an excessive Cu material layer is removed by a chemical mechanical polishing (CMP) process, and a Cu wiring integrated with a flattened conductive via is formed. After that, an insulation film having a Cu diffusion barrier property, not illustrated, is deposited. As the insulation film having a Cu diffusion barrier property, for example, an insulation film of SiN, SiC, SiCN, SiON, or the like can be used. By repeating the above-described processes, wirings 271 including the three-layer metals M1 to M3 are formed.

Next, as illustrated in FIG. 10, a first insulation film 274 having no Cu diffusion barrier property, a second insulation film 275 having no Cu diffusion barrier property, and an insulation film 273 having a Cu diffusion barrier property are sequentially formed. The first insulation film 274 and the second insulation film 275 are formed by using a SiO2 film, a SiCOH film, and the like. Additionally, as the insulation film 273 having a Cu diffusion barrier property, for example, an insulation film of SiN, SiC, SiCN, SiON, or the like can be used as described above. The insulation film 273 having a Cu diffusion barrier property, first insulation film 274, and second insulation film 275 correspond to the interlayer insulation film 260.

Subsequently, the insulation film 273 having a Cu diffusion barrier property, second insulation film 275, and first insulation film 274, which are located on an outermost surface, are patterned and a via hole 278 is selectively opened by the via-first process by using lithography and etching technologies. After that, the second insulation film 275 portion is patterned, and an opening 277 is selectively formed. In other words, patterning is performed so as to have: an opening 276 at a portion corresponding to the connection wiring 269 to be formed; the opening 277 at a portion corresponding to the connection wiring 272 to be formed; and the via hole 278.

Next, as illustrated in FIG. 11, a shielding portion having an opening 268 (connection wiring 269), the conductive via 262 to be connected to the wiring 271, and the connection wiring 272 are formed in a manner embedding Cu materials in the openings 276 and 277 and the via hole 278 by using the dual damascene process, similar to the above. The shielding portion (connection wiring 269) and the connection wiring 272 are formed by using the fourth-layer metal M4. Consequently, the multi-layer wiring layer 270 is formed by use of the wirings 271 including the metals M1 to M4, connection wiring 272, connection wiring 269, interlayer insulation film 260, and insulation films 273 to 275.

Furthermore, an extremely thin uniform insulation thin film 290 is deposited on an upper portion of the multi-layer wiring layer 270.

On the other hand, as illustrated in FIG. 12, a semiconductor well region is formed in a region to be each semiconductor chip portion of a semiconductor substrate 350. A plurality of MOS transistors Tr11 to Tr14 constituting a logic circuit 310 is formed in this semiconductor well region. Here, as described above, the MOS transistors Tr11 to Tr14 are illustrated as the representatives. An above-mentioned element separation region 357 (not illustrated) can be initially formed in advance.

A plurality of layers, in this example, wirings 371 including three-layer metals M11 to M13 are formed including a conductive via 361 via an interlayer insulation film 360 on an upper portion of a front surface 351 side of the semiconductor substrate 350. The wirings 371 can be formed by the dual damascene process. In other words, a connection wiring formed by the via-first process and a wiring gutter are formed at the same time in the interlayer insulation film, a metal film having a Cu diffusion barrier property to prevent (or alternatively, reduce) diffusion of Cu and a Cu seed film are formed, and then a Cu material layer is embedded by the plating process. Examples of the metal film having a Cu diffusion barrier property can include Ta, TaN, Ti, TiN, W, WN, Ru, TiZrN, and an alloy film containing the same. Subsequently, an excessive Cu material layer is removed by a chemical mechanical polishing (CMP) process, and a Cu wiring integrated with a flattened conductive via is formed. After that, an insulation film having a Cu diffusion barrier property (not illustrated) is deposited. As the insulation film having a Cu diffusion barrier property, for example, an insulation film of SiN, SiC, SiCN, SiON, or the like can be used. By repeating the above-described processes, the wirings 371 including the three-layer metals M11 to M13 are formed.

Next, as illustrated in FIG. 13, a first insulation film 374 having no Cu diffusion barrier property, a second insulation film 375 having no Cu diffusion barrier property, and an insulation film 373 having a Cu diffusion barrier property are sequentially formed. The first insulation film 374 and the second insulation film 375 are formed by using a SiO2 film, a SiCOH film, and the like. Additionally, as the insulation film 373 having a Cu diffusion barrier property, for example, an insulation film of SiN, SiC, SiCN, SiON, or the like can be used as described above. The insulation film having a Cu diffusion barrier property 373, first insulation film 374, and second insulation film 375 correspond to the interlayer insulation film. Subsequently, the insulation film 373 having a Cu diffusion barrier property, second insulation film 375, and first insulation film 374, which are located on an outermost surface, are patterned and a via hole 378 is selectively opened by the via-first process using lithography and etching technologies. After that, the second insulation film 375 portion is patterned, and openings 376 and 377 are selectively formed.

Next, as illustrated in FIG. 14, a connection wiring 369, a conductive via 361 to be connected to the wiring 371, and a connection wiring 372 are formed in a manner embedding Cu materials in the openings 376 and 377 and the via hole 378 by using the dual damascene process, similar to the above. The connection wiring 369 and the connection wiring 372 are formed by using the fourth-layer metal M14. Consequently, the multi-layer wiring layer 370 is formed by use of the wirings 371 including the metals M11 to M13, connection wiring 372, connection wiring 369, interlayer insulation film 360, and insulation films 373 to 375.

Furthermore, an extremely thin uniform insulation thin film 390 is deposited on an upper portion of the multi-layer wiring layer 370.

Next, as illustrated in FIG. 15, the first semiconductor substrate 200 and the second semiconductor substrate 300 are bonded such that multi-layer wiring layers face each other and the connection wirings 272 and 372 of the both semiconductor substrates directly contact each other to be electrically connected. In short, the first semiconductor substrate 200 and the second semiconductor substrate 300 are physically bonded and further electrically connected. At this point, the connection wiring 269 and the connection wiring 369 are also directly bonded in overlapping portions. In other words, thermal diffusion bonding is applied in bonding between the connection wirings 272 and 372 and bonding between the connection wiring 269 and the connection wiring 369 by performing heat treatment. A heat treatment temperature at this point can be set to about 100° C. to 500° C.

Additionally, insulation films serving as the interlayer insulation films are subjected to surface treatment to be bonded to each other by plasma bonding. Note that the insulation films serving as the interlayer insulation films can also be bonded to each other with an adhesive.

Thus, a first conductor of the connection wiring 269 and a second conductor of the connection wiring 369 are electrically connected in the vicinity of the bonding surface 299 because the bonding surface 299 is initially sandwiched in the insulation films in advance and crystals of copper serving as the conductors are made to grow by heat application. Therefore, the first conductor and the second conductor are respectively arranged closer to the bonding surface 299 side than the logic circuit 310 and the wiring 271 formed on the first semiconductor substrate 200 and the second semiconductor substrate 300 are.

Next, as illustrated in FIG. 16, a semiconductor substrate 250 is made thin by performing grinding and polishing using the CMP process or the like such that a necessary film thickness of the photodiode PD from the back surface side remains.

Next, as illustrated in FIG. 17, a light shielding film 231 is formed on the thinned surface while including a photodiode PD corresponding to the optical black region via an insulation film 240. Additionally, a color filter 221 and an on-chip lens 222 are formed on a photodiode PD corresponding to an effective pixel array via a flattened film 232.

Then, semiconductor chipping to separate the bonded first semiconductor substrate 200 and second semiconductor substrate 300 into respective semiconductor chips is performed to obtain a solid-state imaging device 100.

Here, as the conductive layers (connection wirings 269 and 369) constituting bonding surface wirings 280, the connection wirings 272 and 372, and the metals M4 and M14 serving as the wirings in the same layer as these, a single material of Cu, Al, W, Ti, Ta, Mo, Ru, and or the like or an alloy thereof can be used.

In a case where a ratio of area of both of the connection wirings 269 and 369 is increased, a speed of a bonding wave at the time of wafer bonding becomes non-uniform, and as a result, it is considered that a portion where a bonding speed becomes relatively slow is generated at an outer periphery of the wafer and a region that is not bonded, namely, a void is formed. Therefore, it is preferable to reduce the ratio of any one of the connection wirings 269 and 369 in order to increase a ratio of the conductors at the bonding surface. Changing the occupied ratios of the upper and lower conductors (connection wirings 269 and 369) is expressed as "making asymmetry". Additionally, a certain size of a region where the insulation film is bonded to the insulation film is to be secured in order to enhance bonding strength. Therefore, in the present embodiment, a plurality of the bonding surface wirings 280 is arranged thin in the wiring direction to increase the ratio of the insulation films at the bonding surface 299, and the intermediate wiring 363 is made to function as a current path by forming the shape of the intermediate wiring 363 in a trench-like shape, thereby reducing wiring resistance.

Thus, in the embodiment of the present technology, the connection wiring 369 in the vicinity of the bonding surface 299 between the plurality of semiconductor chips is set to have the low coverage ratio, the intermediate wiring 363 of the connection wiring 369 is formed in a trench-like shape, and the portion of the intermediate wiring 363 is also integrated with the connection wiring 369 to function as a wiring layer. With this structure, even when the coverage ratio is low at the bonding surface 299, wiring resistance can be reduced by, for example, lining the wiring 371 located in the logic circuit 310 of the second semiconductor substrate 300. As a result, it is possible to provide a solid-state imaging device with high productivity.

2. MODIFIED EXAMPLES

First Modified Example

FIG. 18 is a cross-sectional view of a solid-state imaging device according to a first modified example according to the embodiment of the present technology. In the first modified example, an electrode 201 of the first semiconductor substrate 200 and an electrode 301 of the second semiconductor substrate 300 are connected at the bonding surface 299.

A connection wiring 202 of the first semiconductor substrate 200 and a connection wiring 302 of the second semiconductor substrate 300 are general wirings, and although a planar shape thereof is shown in FIG. 18 as having slanted sides, the shape may also be a square, a circle, or the like having an aspect ratio of 1. On the other hand, a connection wiring 303 of the second semiconductor substrate 300 has a planar shape formed in a trench-like shape, and is connected to a wiring 309. Therefore, this connection wiring 303 is also used as a current path.

Note that the present first modified example is provided for comparison with other modified examples and basically similar to the above-described embodiment.

Second Modified Example

FIG. 19 is a cross-sectional view of a solid-state imaging device according to a second modified example of the embodiment of the present technology. In the second modified example, a connection wiring 203 having a planar shape formed in a trench-like shape is provided in the first semiconductor substrate 200 in addition to the above-described structure of the first modified example. The connection wiring 203 is connected to a wiring 209 and also used as a current path. In other words, the second modified example is an example in which the trench-shaped connection wirings 203 and 303 are included in the first semiconductor substrate 200 and the second semiconductor substrate 300 respectively.

Third Modified Example

FIG. 20 is a cross-sectional view of a solid-state imaging device according to a third modified example of the embodiment of the present technology. In the third modified example, the first semiconductor substrate 200 has a structure not including any electrode 201, compared with the structure of the above-described first modified example. Therefore, provided is a structure in which the connection wiring 202 of the first semiconductor substrate 200 and the electrode 301 of the second semiconductor substrate 300 are connected at the bonding surface 299. The structure of the second semiconductor substrate 300 is similar to that of the above-described first modified example.

Fourth Modified Example

FIG. 21 is a cross-sectional view of a solid-state imaging device according to a fourth modified example of the embodiment of the present technology. In the fourth modified example, the second semiconductor substrate 300 also has a structure not including any electrode 301, compared with the structure of the above third modified example. Therefore, provided is a structure in which a connection wiring 204 of the first semiconductor substrate 200 and a connection wiring 304 of the second semiconductor substrate 300 are directly connected at the bonding surface 299.

Fifth Modified Example

FIG. 22 is a cross-sectional view of a fifth modified example of the solid-state imaging device in the embodiment of the present technology. In the fifth modified example, a connection wiring 203 having a planar shape formed in a trench-like shape is provided in the first semiconductor substrate 200 in the structure of the above-described fourth modified example. The connection wiring 203 is connected to a wiring 209 and also used as a current path. However, since electrodes 201 and 301 are not included, provided is a structure in which the connection wirings 203 and 204 of the first semiconductor substrate 200 and the connection wirings 303 and 304 of the second semiconductor substrate 300 are directly connected at the bonding surface 299.

Sixth Modified Example

FIG. 23 is a cross-sectional view of a solid-state imaging device according to a sixth modified example of the embodiment of the present technology. In the sixth modified example, the second semiconductor substrate 300 has a structure including no connection wiring 303 in the structure of the above-described second modified example. In other words, the sixth modified example is an example in which a connection wiring 203 formed in a trench-like shape is included in the first semiconductor substrate 200.

Seventh Modified Example

FIG. 24 is a cross-sectional view of a solid-state imaging device according to a seventh modified example of the embodiment of the present technology. In the seventh modified example, the second semiconductor substrate 300 has a structure including neither a connection wiring 303 nor an electrode 301 to be connected to the connection wiring 303 in the structure of the above-described sixth modified example.

Eighth Modified Example

FIG. 25 is a cross-sectional view of a solid-state imaging device according to an eighth modified example of the embodiment of the present technology. In the eighth modified example, the second semiconductor substrate 300 has a structure including no connection wiring 303 in the structure of the above-described fifth modified example.

Note that, in these modified examples, the electrodes 201 and 301 are examples of the electric conductors specified in the claims. Additionally, the connection wirings 202 to 204 and 302 to 304 are examples of the connection wirings specified in the claims.

Ninth Modified Example

FIG. 26 is a cross-sectional view of a solid-state imaging device according to a ninth modified example of the embodiment of the present technology. In the above-described embodiment, described is the example in which the two layers including the first semiconductor substrate 200 and the second semiconductor substrate 300 are stacked, but the present technology is not limited thereto. In the ninth modified example, illustrated is an example in which a first semiconductor substrate 200, a second semiconductor substrate 300, and a third semiconductor substrate 400 are stacked.

The third semiconductor substrate 400 is bonded to the second semiconductor substrate 300 at a bonding surface 399. A wiring 371 of the second semiconductor substrate 300 and a wiring 471 of the third semiconductor substrate 400 are electrically connected by a wiring 391.

Assuming that three semiconductor substrates are stacked like the ninth modified example, an image sensor can have advanced functions and a chip size can be miniaturized by stacking substrates having various functions. For example, more advanced functions can be achieved by arranging memories in a second layer and a third layer in the three-layer substrates. Meanwhile, the example of stacking the three layers of semiconductor substrates has been described here, but four or more layers thereof may also be stacked.

Note that the above-described embodiment is provided as the example to embody the present technology, and matters in the embodiment may respectively correspond to the matters specified in the claims. Similarly, the matters specified in the claims may respectively correspond to the matters denoted by the same names in the embodiment of the present technology. However, the present technology is not limited to the embodiment and can be embodied by applying various modifications to the embodiment without departing from the gist thereof.

Note that the effects described in the present specification are merely the examples and not limited thereto, and further additional effects may also be provided.

Note that the present technology may also adopt the following configurations.

(1) A semiconductor device including a stacked semiconductor substrate obtained by electrically connecting and bonding multi-layer wiring layers of a plurality of semiconductor substrates each formed with the multi-layer wiring layer, in which, in the stacked semiconductor substrate, a wiring including a conductor formed in vicinity of a bonding surface between the plurality of semiconductor substrates has a connection hole having a planar shape formed in a trench-like shape.

(2) The semiconductor device recited in (1) above, in which the trench-like shape of the connection hole is a rectangular shape having a planar aspect ratio larger than 1.

(3) The semiconductor device according to (1) above, in which the trench-like shape of the connection hole is an elliptical shape having a planar aspect ratio of greater than 1.

(4) The semiconductor device according to (1) above, in which the trench-like shape of the connection hole is a polygonal shape formed by combining rectangles each having a planar aspect ratio larger than 1.

(5) The semiconductor device recited in any one of (1) to (4) above, in which the conductor has a thin shape in a wiring direction, and a plurality of conductors having the same potential is arranged.

(6) The semiconductor device recited in any one of (1) to (5) above, in which the conductor is a copper wiring.

(7) The semiconductor device recited in any one of (1) to (6) above, in which an area ratio of the conductor formed in the vicinity of the bonding surface between the plurality of semiconductor substrates is lower than about 50%.

(8) The semiconductor device recited in any one of (1) to (7) above, constituting a solid-state imaging device, in which a first semiconductor substrate out of the plurality of semiconductor substrates includes a pixel array of an imaging element, and a second semiconductor substrate out of the plurality of semiconductor substrates includes a logic circuit.

(9) The semiconductor device recited in (8) above, in which a wiring including the conductor is formed in the first semiconductor substrate.

(10) The semiconductor device recited in (8) above, in which a wiring including the conductor is formed in the second semiconductor substrate.

(11) An imaging device, comprising:

a first substrate including a pixel array and a first multilayer wiring layer, the first multilayer wiring layer including:

a first wiring that receives electrical signals based on electric charge generated by at least one photoelectric conversion unit; and a plurality of second wirings; and a second substrate including a second multilayer wiring layer and a logic circuit that processes the electrical signals, the second multilayer wiring layer including:

a third wiring bonded to the first wiring; and a plurality of fourth wirings, at least one of the plurality of fourth wirings being bonded to at least one of the plurality of second wirings, wherein the second multilayer wiring layer includes at least one fifth wiring that is connected to the plurality of fourth wirings and that receives a power supply signal, and wherein the first wiring and the third wiring are closer to edges of the first and second substrates than the plurality of second wirings, the plurality of fourth wirings, and the at least one fifth wiring.

(12) The imaging device of (11), wherein the second multilayer wiring layer further comprises:

a plurality of sixth wirings, one of the sixth wirings connected between the at least one fifth wiring and one of the plurality of second wirings or the plurality of fourth wirings.

(13) The imaging device of one or more of (11) to (12), wherein a height and a width of each of the plurality of sixth wirings are different.

(14) The imaging device of one or more of (11) to (13), wherein the width is greater than the height.

(15) The imaging device of one or more of (11) to (14), wherein the width of each of the plurality of sixth wirings is less than a width of each of the plurality of fourth wirings.

(16) The imaging device of one or more of (11) to (15), wherein the at least one fifth wiring is wider than the plurality of fourth wirings and the plurality of sixth wirings.

(17) The imaging device of one or more of (11) to (16), wherein the first wiring is connected to a first conductive via in the first substrate, and wherein the third wiring is connected to a second conductive via in the second substrate.

(18) The imaging device of one or more of (11) to (17), wherein the first multilayer wiring layer further comprises:

a plurality of seventh wirings having respective first ends connected to respective ones of the plurality of second wirings.

(19) The imaging device of one or more of (11) to (18), wherein the first multilayer wiring layer further comprises:

a plurality of eighth wirings connected to respective second ends of the plurality of seventh wirings.

(20) The imaging device of one or more of (11) to (19), further comprising: a third substrate bonded to the second substrate, wherein the third substrate includes a memory.

(21) An imaging device, comprising:

a first substrate including a first multilayer wiring layer, the first multilayer wiring layer including:

a first wiring for bonding the first substrate to a second substrate and that receives electrical signals based on electric charge generated by at least one photoelectric conversion unit;

a plurality of second wirings for bonding the first substrate to the second substrate;

at least one third wiring that receives a power supply signal; and a plurality of fourth wirings that connect the at least one third wiring to the plurality of second wirings;

wherein the at least one third wiring is wider than the plurality of second wirings and the plurality of fourth wirings, and wherein, the plurality of second wirings, the at least one third wiring, and the plurality of fourth wirings are located closer to at least a portion of a pixel region than the first wiring.

(22) The imaging device of (21), further comprising:

the second substrate including a second multilayer wiring layer and a logic circuit that processes the electrical signals, wherein the second multilayer wiring layer includes:

a fifth wiring bonded to the first wiring; and a plurality of sixth wirings bonded to the plurality of second wirings, wherein the plurality of second wirings, the at least one third wiring, and the plurality of fourth wirings overlap the portion of the pixel region.

(23) The imaging device of (22), wherein the second multilayer wiring layer further comprises:

a plurality of seventh wirings located at a different level in the second multilayer wiring layer than the plurality of sixth wirings; and a plurality of eighth wirings connected between the plurality of seventh wirings and the plurality of sixth wirings.

(24) The imaging device of one or more of (21) to (23), wherein the plurality of seventh wirings are wider than the plurality of eighth wirings.

(25) The imaging device of one or more of (21) to (24), wherein the fifth wiring and the first wiring are closer to edges of the first and second substrates than the plurality of second wirings and the plurality of sixth wirings.

(26) The imaging device of one or more of (21) to (25), wherein the first wiring is connected to a first conductive via, and the fifth wiring is connected to a second conductive via.

(27) The imaging device of one or more of (21) to (26), further comprising:

a third substrate bonded to the second substrate, wherein the third substrate includes a memory.

(28) An imaging device, comprising:

a first substrate including a pixel array and a first multilayer wiring layer, the first multilayer wiring layer including:

a first wiring that receives electrical signals based on electric charge generated by at least one photoelectric conversion unit; and a plurality of second wirings; and a second substrate including a second multilayer wiring layer and a logic circuit that processes the electrical signals, the second multilayer wiring layer including:

a third wiring bonded to the first wiring; and a plurality of fourth wirings bonded to the plurality of second wirings, wherein the first wiring and the third wiring are closer to edges of the first and second substrates than the plurality of second wirings, the plurality of fourth wirings, and the at least one fifth wiring, and wherein, in a plan view, the plurality of fourth wirings and the plurality of second wirings overlap at least a portion of a pixel region of the pixel array.

(29) The imaging device of (28), wherein the second multilayer wiring layer includes at least one fifth wiring that is connected to the plurality of fourth wirings, wherein the at least one fifth wiring receives a power supply signal.

(30) The imaging device of one or more of (28) to (29), wherein the second substrate includes a plurality of sixth wirings that connect the at least one fifth wiring to the plurality of fourth wirings.

REFERENCE SIGNS LIST

100 Solid-state imaging device
200 First semiconductor substrate
300 Second semiconductor substrate
400 Third semiconductor substrate
201, 301 Electrode
202 to 204, 302 to 304 Connection wiring
209, 309 Wiring
210 Pixel array
211 Optical black region
212 Effective pixel array
221 Color filter
222 On-chip lens
231 Light shielding film 232 Flattened film
240 Insulation film
250, 350 Semiconductor substrate
252, 352 Gate electrode
253 N-type semiconductor region
254 P-type semiconductor region
256, 356 Source/drain region
257, 357 Element separation region
260, 360 Interlayer insulation film
261, 262, 361 Conductive via
268 Opening
269, 369 Connection wiring
270, 370 Multi-layer wiring layer
271, 371, 471 Wiring
272, 372 Connection wiring
273 to 275, 373 to 375 Insulation film
276, 277, 376, 377 Opening
278, 378 Via hole
280 Bonding surface wiring
290, 390 Insulation thin film
299, 399 Bonding surface
310 Logic circuit
363 Connection wiring
391 Wiring

What is claimed is:

1. An imaging device, comprising:
a first substrate including a pixel array and a first multilayer wiring layer, the first multilayer wiring layer including:
a first wiring that receives electrical signals based on electric charge generated by at least one photoelectric conversion unit; and
a plurality of second wirings; and
a second substrate including a second multilayer wiring layer and a logic circuit that processes the electrical signals, the second multilayer wiring layer including:
a third wiring bonded to the first wiring; and
a plurality of fourth wirings, at least one of the plurality of fourth wirings being bonded to at least one of the plurality of second wirings,
wherein the second multilayer wiring layer includes at least one fifth wiring that is connected to the plurality of fourth wirings and that receives a power supply signal, and
wherein the first wiring and the third wiring are closer to edges of the first and second substrates than the plurality of second wirings, the plurality of fourth wirings, and the at least one fifth wiring.

2. The imaging device of claim 1, wherein the second multilayer wiring layer further comprises:
a plurality of sixth wirings, one of the sixth wirings connected between the at least one fifth wiring and one of the plurality of second wirings or the plurality of fourth wirings.

3. The imaging device of claim 2, wherein a height and a width of each of the plurality of sixth wirings are different.

4. The imaging device of claim 3, wherein the width is greater than the height.

5. The imaging device of claim 4, wherein the width of each of the plurality of sixth wirings is less than a width of each of the plurality of fourth wirings.

6. The imaging device of claim 2, wherein the at least one fifth wiring is wider than the plurality of fourth wirings and the plurality of sixth wirings.

7. The imaging device of claim 1, wherein the first wiring is connected to a first conductive via in the first substrate, and wherein the third wiring is connected to a second conductive via in the second substrate.

8. The imaging device of claim 2, wherein the first multilayer wiring layer further comprises:
a plurality of seventh wirings having respective first ends connected to respective ones of the plurality of second wirings.

9. The imaging device of claim 8, wherein the first multilayer wiring layer further comprises:
a plurality of eighth wirings connected to respective second ends of the plurality of seventh wirings.

10. The imaging device of claim 1, further comprising:
a third substrate bonded to the second substrate, wherein the third substrate includes a memory.

11. An imaging device, comprising:
a first substrate including a first multilayer wiring layer, the first multilayer wiring layer including:
a first wiring for bonding the first substrate to a second substrate and that receives electrical signals based on electric charge generated by at least one photoelectric conversion unit;
a plurality of second wirings for bonding the first substrate to the second substrate;
at least one third wiring that receives a power supply signal; and
a plurality of fourth wirings that connect the at least one third wiring to the plurality of second wirings;
wherein the at least one third wiring is wider than the plurality of second wirings and the plurality of fourth wirings, and
wherein, the plurality of second wirings, the at least one third wiring, and the plurality of fourth wirings are located closer to at least a portion of a pixel region than the first wiring.

12. The imaging device of claim 11, further comprising:
the second substrate including a second multilayer wiring layer and a logic circuit that processes the electrical signals, wherein the second multilayer wiring layer includes:
a fifth wiring bonded to the first wiring; and
a plurality of sixth wirings bonded to the plurality of second wirings, wherein the plurality of second wirings, the at least one third wiring, and the plurality of fourth wirings overlap the portion of the pixel region.

13. The imaging device of claim 12, wherein the second multilayer wiring layer further comprises:
a plurality of seventh wirings located at a different level in the second multilayer wiring layer than the plurality of sixth wirings; and
a plurality of eighth wirings connected between the plurality of seventh wirings and the plurality of sixth wirings.

14. The imaging device of claim 13, wherein the plurality of seventh wirings are wider than the plurality of eighth wirings.

15. The imaging device of claim 12, wherein the fifth wiring and the first wiring are closer to edges of the first and second substrates than the plurality of second wirings and the plurality of sixth wirings.

16. The imaging device of claim 12, wherein the first wiring is connected to a first conductive via, and the fifth wiring is connected to a second conductive via.

17. The imaging device of claim 12, further comprising:
a third substrate bonded to the second substrate, wherein the third substrate includes a memory.

18. An imaging device, comprising:
a first substrate including a pixel array and a first multilayer wiring layer, the first multilayer wiring layer including:
  a first wiring that receives electrical signals based on electric charge generated by at least one photoelectric conversion unit; and
  a plurality of second wirings; and
a second substrate including a second multilayer wiring layer and a logic circuit that processes the electrical signals, the second multilayer wiring layer including:
  a third wiring bonded to the first wiring; and
  a plurality of fourth wirings bonded to the plurality of second wirings,
wherein the first wiring and the third wiring are closer to edges of the first and second substrates than the plurality of second wirings, the plurality of fourth wirings, and the at least one fifth wiring, and
wherein, in a plan view, the plurality of fourth wirings and the plurality of second wirings overlap at least a portion of a pixel region of the pixel array.

19. The imaging device of claim 18, wherein the second multilayer wiring layer includes at least one fifth wiring that is connected to the plurality of fourth wirings, wherein the at least one fifth wiring receives a power supply signal.

20. The imaging device of claim 19, wherein the second substrate includes a plurality of sixth wirings that connect the at least one fifth wiring to the plurality of fourth wirings.

* * * * *